US011987491B2

(12) United States Patent
Dürr et al.

(10) Patent No.: US 11,987,491 B2
(45) Date of Patent: May 21, 2024

(54) MEMS ACTUATOR ELEMENT AND MEMS ACTUATOR ARRAY WITH A PLURALITY OF MEMS ACTUATOR ELEMENTS

(71) Applicant: Fraunhofer-Gesellschaft zur Förderung der angewandten Forschung e.V., Munich (DE)

(72) Inventors: Peter Dürr, Dresden (DE); Andreas Neudert, Dresden (DE); Linda Skatulla, Reutlingen (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 328 days.

(21) Appl. No.: 17/568,201

(22) Filed: Jan. 4, 2022

(65) Prior Publication Data

US 2022/0119243 A1    Apr. 21, 2022

Related U.S. Application Data

(63) Continuation of application No. PCT/EP2020/069101, filed on Jul. 7, 2020.

(30) Foreign Application Priority Data

Jul. 8, 2019  (DE) ............. 10 2019 210 020.1

(51) Int. Cl.
*B81B 3/00*   (2006.01)
(52) U.S. Cl.
CPC ...... *B81B 3/0027* (2013.01); *B81B 2201/033* (2013.01); *B81B 2203/04* (2013.01)
(58) Field of Classification Search
CPC ............ B81B 3/0021; G02B 26/0841; H02N 1/002–008
See application file for complete search history.

(56) References Cited

U.S. PATENT DOCUMENTS 4,772,786 A    9/1988  Langdon
6,384,952 B1   5/2002  Clark et al.
(Continued)

FOREIGN PATENT DOCUMENTS

DE   10 2015 200 626 B3   7/2016
DE   10 2018 207 783 A1   11/2019
(Continued)

OTHER PUBLICATIONS

Veljko et al. High Aspect Ratio micormirrors 2004, IEEE 3292676, pp. 1891-1893.*
(Continued)

*Primary Examiner* — Moazzam Hossain
(74) *Attorney, Agent, or Firm* — McClure, Qualey & Rodack, LLP

(57) ABSTRACT

A MEMS (micro-electromechanical system) actuator element includes a substrate, a stationary first electrode structure with an edge structure, a second electrode structure with an edge structure, wherein the second electrode structure is deflectably coupled to the substrate by means of a spring structure and electrostatically deflectable by means of the first electrode structure to move the edge structure of the second electrode structure into an intermediate position between a minimum and maximum vertical deflection position, wherein the minimum and maximum deflection position specify a maximum deflection path, wherein the edge structures of the first and second electrode structures are to each other and are vertically spaced apart in the minimum deflection position and wherein, in the maximum deflection position, the vertical immersion path of the edge structure of the second electrode structure into the edge structure of the first electrode structure is up to 0.5 times the maximum deflection path $z_S$.

30 Claims, 12 Drawing Sheets

(56) References Cited

U.S. PATENT DOCUMENTS

| | | | |
|---|---|---|---|
| 7,295,726 | B1 | 11/2007 | Milanovic et al. |
| 7,929,192 | B2 | 4/2011 | Sandner |
| 2006/0119216 | A1 | 6/2006 | Kouma et al. |
| 2007/0284964 | A1 | 12/2007 | Chung et al. |
| 2008/0239429 | A1 | 10/2008 | Sandner |
| 2014/0362460 | A1* | 12/2014 | Nozu .............. H02N 1/008 359/849 |
| 2017/0297897 | A1 | 10/2017 | Duerr et al. |

FOREIGN PATENT DOCUMENTS

| | | |
|---|---|---|
| EP | 1 640 781 A2 | 3/2006 |
| WO | 2002/059942 A2 | 8/2002 |
| WO | 2016/020716 A1 | 2/2016 |
| WO | 2019/219511 A1 | 11/2019 |

OTHER PUBLICATIONS

International Search Report and Written Opinion issued in application No. PCT/EP2020/069101.

Düurr, P., et al.,: "Micro-actuator with extended analog deflection at low drive voltage;" Proceedings of SPIE vol. 6114; 2006; pp. 1-10.

Gehner, A., et al.; "Micromirror arrays for wavefront correction;" Proc. SPIE vol. 4178 Micromachining and Microfabrication; Sep. 2000; pp. 348-357.

Lakner, H., et al.; "Design and Fabrication of Micromirror Arrays for UV-Lithography;" Proc of SPIE vol. 4561; 2001; pp. 1-10.

Schenk, H., et al.; "A Novel Electrostatically Driven Torsional Actuator," Proc. 3rd Int. Conf. on Micro Opto Electro Mechanical Systems; Sep. 1999; pp. 1-8.

Hah, D., et al.; "Theory and experiments of angular vertical comb-drive actuators for scanning micromirrors;" IEEE Journal of Selected Topics in Quantum Electronics, vol. 10, No. 3; May/Jun. 2004; pp. 505-513.

Zhang, Q.X., et al.; "Fabrication technique for microelectromechanical systems vertical comb-drive actuators on a monolithic silicon substrate;" Journal of Vacuum Science & Technology B: Microelectronics and Nanometer Structure Processing, Measurement, and Phenomena 23.1; Jan./Feb. 2005; pp. 32-41.

Bartlett, T., et al.; "Adapting Texas Instruments DLP technology to demonstrate a phase spatial light modulator," Emerging Digital Micromirror Device Based Systems and Applications XI; Feb. 2019; pp. 1-14.

Hah, D., et al.; "Low-Voltage, Large-Scan Angle MEMS Analog Micromirror Arrays with Hidden Vertical Comb-Drive Actuators;" Journal of Microelectromechanical Systems, vol. 13, No. 2; Apr. 2004; pp. 279-289.

* cited by examiner

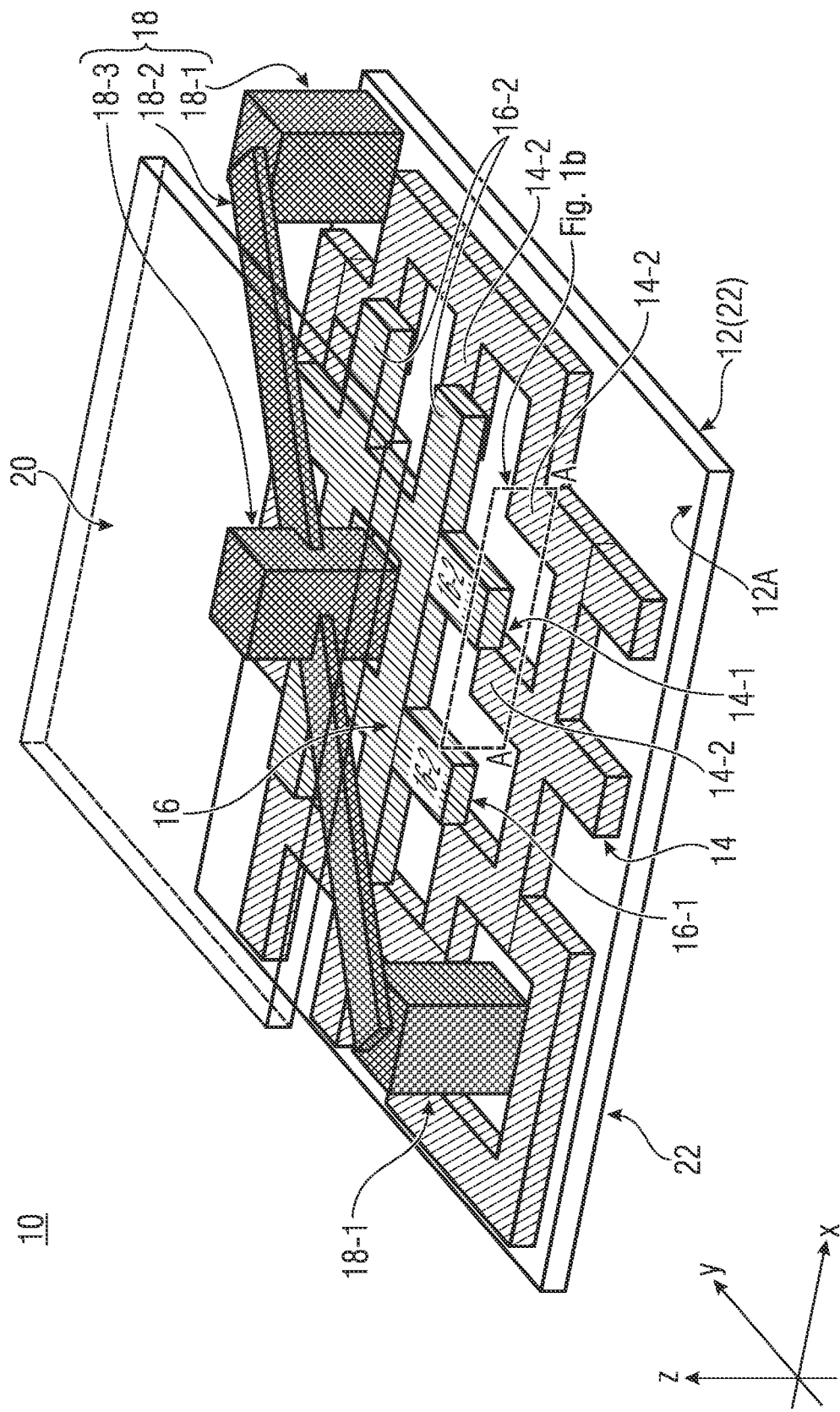

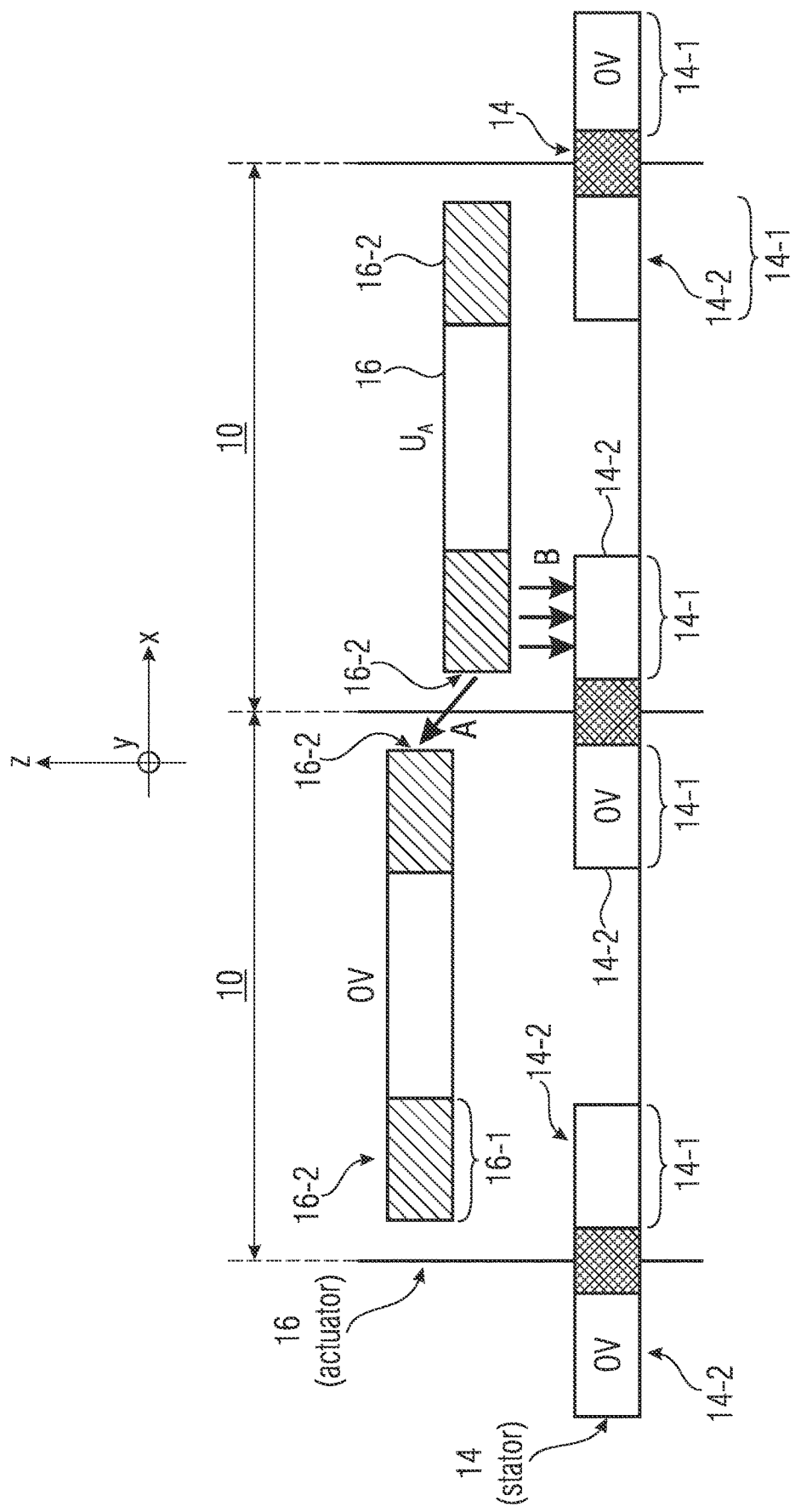

MEMS ACTUATOR ELEMENT AND MEMS ACTUATOR ARRAY WITH A PLURALITY OF MEMS ACTUATOR ELEMENTS

CROSS-REFERENCE TO RELATED APPLICATIONS

This application is a continuation of copending International Application No. PCT/EP2020/069101, filed Jul. 7, 2020, which is incorporated herein by reference in its entirety, and additionally claims priority from German Application No. 102019210020.1, filed Jul. 8, 2019, which is also incorporated herein by reference in its entirety.

The present invention relates to a MEMS actuator element (MEMS=microelectromechanical system) and its structure and further to a MEMS actuator array having a plurality of MEMS actuator elements. Further, embodiments relate to a MEMS actuator element having a comb drive and improved linearity.

BACKGROUND OF THE INVENTION

MEMS actuator elements (also simply called actuators below) according to embodiments can be used for a wide range of applications, such as scanner mirrors, optical switches for coupling optical fibers (optical cross-connect), microvalves, electric microswitches, and others. Particularly relevant applications are spatial light modulators where the actuators mostly as two-dimensional array move micromirrors connected therewith and position the same as desired.

In the following, the technical background will be discussed, wherein respective findings and conclusions of the inventors regarding the technical background are summarized, e.g., with reference to the cited references.

Mostly, the position of a moveable actuator part is controlled by an applied electric signal. In many cases, the electrostatic attractive force is used as physical effect, but electromagnetic forces as well as piezoelectric or thermal expansion can also be used.

Due to the type of executable movement, differentiation is made between rotating or tilting actuators and transitory actuators, as well as actuator types allowing both types of movement. In the latter case, the motion components either can be firmly coupled by the type of suspension or can be individually adjusted by several control signals (e.g., piston-tip-tilt). This invention can be used for all these types of movement. In the following description of the embodiments, for example, translatory actuators will be addressed, specifically those that are coupled to micromirrors for phase adjustment of light reflected therefrom. However, the description is equally applicable to rotating or tilting actuators.

Frequently, such actuators are arranged in large numbers densely packed on a carrier substrate in one plane and the desired deflection direction is perpendicular to that plane. This is also referred to as micromirror array. The shape and size of the micromirrors and the needed deflection are mostly specified by the application and by optical circumstances. Small mirrors allow large angles of deflection and are therefore frequently used. However, their size also limits the available space for the underlying memory cell of the electronic control as well as for the constructive configuration of the actuator and hence the possible driving force. In addition, dense packing favors crosstalk, such that an actuator can also inconveniently react to the control signal of the adjacent actuators.

In the currently known electrostatically controlled analog micromirror arrays having a large to very large number of pixels (such as approximately >1000 up to several millions), normally, plate actuators are used [2, 3]. The same have a relatively simple design and are easy to produce and can represent adequate solutions as long as the individual pixels are still significantly larger than approximately 20 times the desired deflection. In plate actuators, the field is homogenous in a reasonable approximation and the moveable part can mostly be deflected in field direction.

However, plate actuators show the known pull-in effect that makes, in parallel plates, all positions starting from a deflection of one third of the initial distance of the plate at 0V applied voltage unstable and hence unusable [2]. Actually, the deflection characteristic curve close to the pull-in state is already so steep that in practice only a significantly smaller area of the initial distance can be used, such as only 20%, possibly 25%. If, for example for phase modulation of visible light, deflection of at least 320 nm ($2\pi$ modulation range) is needed, an initial distance of at least 1.3 µm, rather 1.6 µm, results. This large distance results in relatively small electrostatic forces (since the force decreases proportionally to the reciprocal of the square of the distance) and for pixel sizes significantly below 10 µm in hardly controllable crosstalk of the adjacent pixels.

In micromirror arrays having a lot of pixels, it is advantageous to separate the acting address voltage in two contributions: a fixed voltage that is the same for all (or a lot of) pixels, which is called bias voltage and results in a starting position of the actuators differing from the voltage-free resting position as well as an address voltage different for each individual pixel, depending on the desired position, that can be adjusted between 0V and a maximum value. With a limited address voltage range, providing the bias voltage can generate a greater actuator force at maximum deflection, such that harder springs can be used. Additionally, the linearity of the characteristic curve is improved. On the other hand, the useful deflection range of a given actuator decreases between the starting position given by the bias voltage and the end position of the actuator given by the safety distance from the pull-in point. This comes generally at the cost of a further increased distance of the electrodes, which again results in increased crosstalk. Additionally, the advantage of higher force development is partly used up again by the greater electrode gap.

Electrostatic comb drives, however, are so far mostly used in microsystems with single or only a few larger micromirrors (or other moveable members such as the mass in inertial sensors), e.g., [4, 7]. The common bulk micromechanical production methods mostly have structure sizes (e.g., finger widths) of several micrometers and are not well suited for pixels that should be only a few micrometers in size.

Comb drives can be configured for actuator deflection in parallel to the electro planes or fingers or, as an alternative, essentially perpendicular thereto. The latter is frequently referred to as a vertical comb drive, since the electrode planes are mostly parallel to a surface of a substrate as production planes. In that case, the movement of the actuator to both sides is not limited and very large deflections can be obtained in resonant operation [4].

Obviously, according to embodiments, depending on the production technology, the actuators can also be oriented differently, the argumentation applies accordingly, wherein such vertical comb drives are optimized for the outlined boundary conditions according to embodiments of the present invention.

The known microsystems with vertical comb drives can be divided in those where the electrodes (combs) are in a common plane after finishing and without applied voltage, and others where the static and moveable electrodes are each located in an individual plane. The latter can be obtained by producing the electrodes directly in different planes, e.g., [5], wherein one part of the electrodes is brought into a new resting position from their original position by a later step in the production process, e.g., [6], or by shortening the two electrodes on different sides by a specific etching, e.g., [7]. In all these cases, an actuator results that can be analogously deflected when applying a static address voltage. On the other hand, an actuator having both electrodes in one plane can only be resonantly excited and would not be suitable for the present object.

In the case of electrodes in two planes, in conventional technology, electrodes are known that already overlap in the resting position (without applied voltage) or are immersed into each other, i.e., the lower edge of the upper electrode comb is located lower than the upper edge of the lower comb, wherein the fingers are each located in the gaps of the other comb. This is selected in that way as the comb drive with a given design and given address voltage only unfolds its full power when the combs are immersed into each other. With sufficiently deep immersion, calculating the force is generally quite simple and the system is therefore generally easy to understand and to dimension.

Comb drives have the advantage that they have no pull-in state in the desired operating direction and therefore the deflection can even be greater than the resting distance of the electrodes. Here, the desired vertical force is the greater the smaller the horizontal distance of the electrode edges. A lower limit for the horizontal electrode gap results due to the much larger horizontal forces that the individual fingers apply onto each other. In perfectly produced systems, all horizontal forces add up to 0, but already smallest inaccuracies can result in enormous horizontal net forces that can even destroy such an actuator (horizontal pull-in). This effect is even more critical the greater the electrode overlap. Obviously, the latter is even greater in full deflection of the actuator than in the resting position.

There are also known systems where the electrodes are located "edge on edge" in the resting position or systems having a low vertical distance. The latter is mostly caused by production because of an etch stop layer or connecting layer between the planes of which the electrodes have been produced. Such a distance is accepted as minor disadvantage for simplifying the production, but the potential for optimizing the actuator has so far not been realized.

In all electrostatic actuators, with given configuration and deflection, the actuator force is proportional to the square of the voltage. Additionally, the force increases further while the actuator parts are approaching each other, which mostly results in an undesirably strong non-linear deflection characteristic curve. One option of linearization of the characteristic curve is described in [1]. However, the same may be difficult to apply to very small pixels.

SUMMARY

According to an embodiment, a MEMS actuator element may have: a substrate, a first electrode structure with an edge structure that is stationary with respect to the substrate, a second electrode structure with an edge structure, wherein the second electrode structure is deflectably coupled to the substrate by means of a spring structure and electrostatically deflectable by means of the first electrode structure to move the edge structure of the second electrode structure into an intermediate position between a minimum deflection position and a vertically spaced-apart maximum deflection position, wherein the minimum and maximum deflection positions specify a maximum deflection path, wherein the edge structures of the first and second electrode structures are configured to be opposite to each other with respect to a top view and are vertically spaced apart in the minimum deflection position and wherein, in the maximum deflection position, the vertical immersion path of the edge structure of the second electrode structure into the edge structure of the first electrode structure is up to 0.5 times the maximum deflection path $z_S$, with $z_E \leq 0.5\ z_S$.

According to another embodiment, a MEMS actuator array may have: a plurality of inventive MEMS actuator elements and control means for providing an individual control voltage between the first and second electrode structures of the respective MEMS actuator elements.

According to another embodiment, a MEMS actuator array may have: a plurality of MEMS actuator elements, wherein the MEMS actuator elements include a substrate, a first electrode structure with an edge structure that is stationary with respect to the substrate and a second electrode structure with an edge structure, wherein the second electrode structure is deflectably coupled to the substrate by means of a spring structure and electrostatically deflectable by means of the first electrode structure to move the edge structure of the second electrode structure into an intermediate position between a minimum deflection position and a vertically spaced-apart maximum deflection position, wherein the minimum and maximum deflection positions specify a maximum deflection path, wherein the edge structures of the first and second electrode structures are configured to be opposite to each other with respect to a top view and are vertically spaced apart in a minimum deflection position, wherein, in the maximum deflection position, the vertical immersion path of the edge structure of the second electrode structure into the edge structure of the first electrode structure is up to 0.5 times the maximum deflection path $z_S$, with $z_E \leq 0.5\ z_S$, wherein the first and second electrode structures are spaced apart by a lateral minimum distance in a plane parallel to the substrate, wherein the lateral minimum distance is 0.5 to 1.5 times the maximum deflection path and wherein the vertical thickness of the first and/or second electrode structure is 0.6 to 1.2 times the maximum deflection path and control means for providing an individual control voltage between the first and second electrode structures of the respective MEMS actuator elements, wherein the MEMS actuator elements have a pitch of less than or equal to 20 μm.

According to an aspect, a MEMS actuator element comprises: a substrate, a first electrode structure with an edge structure that is stationary with respect to the substrate, a second electrode structure with an edge structure, wherein the second electrode structure is deflectably coupled to the substrate by means of a spring structure and electrostatically deflectable by means of the first electrode structure to move the edge structure of the second electrode structure into an intermediate position [deflection position] between a minimum deflection position and a vertically spaced-apart maximum deflection position, wherein the minimum and maximum deflection positions specify a maximum deflection path (stroke), wherein the edge structures of the first and second electrode structures are configured to be opposite to each other with respect to a top view and are vertically spaced apart in the minimum deflection position, and wherein, in the maximum deflection position, the vertical immersion path $z_1$ of the edge structure of the second electrode structure into the edge structure of the first electrode structure is up to 0.5 times the maximum deflection path $z_0$ ($z_1 \leq 0.5\ z_0$).

According to a further aspect, a MEMS actuator array comprises a plurality of MEMS actuator elements according to the above aspect and control means for providing an individual control voltage between the first and second electrode structures of the respective MEMS actuator elements.

Embodiments can particularly be applied to micromechanical actuators that are controlled electrostatically and have a restoring elastic suspension applying a respective counterforce for static balance deflection. Thus, the deflection can be adjusted continuously as desired in a specified range and does not have to be limited by mechanical stops.

Thus, embodiments relate, e.g., to such actuators that are frequently referred to as comb drives, where inhomogeneous edge fields play the decisive role and the moveable part can mostly be deflected transversal to the direction of the strongest part of the electric field. In comb drives, by the small electrode gap, the electrostatic field is limited in a spatially narrow range around the electrode fingers.

This results in actuator forces that can turn out to be significantly greater compared to a plate actuator in the actual pixel area even when only very few fingers are possible due to production-related given minimum size of the structures. This already is a decisive advantage, as it makes stronger springs and faster response of the actuator possible. Here, surface micromechanics allow significantly finer structures compared to bulk micromechanics and is therefore advantageous. Additionally, the comb or edge drive enables low crosstalk.

Here, it can be particularly favorable to locate one of the electrode structures having the common potential of all pixels at the edge of the pixels. When this is the stationary electrode, the same can be connected directly to the electrode of the adjacent pixel, which uses correspondingly little space.

For linearization of the characteristic curve with bearable loss of maximum actuator force, particularly good overall results can be obtained when the design parameters are optimized as follows (depending on the weighting of the different target parameters): in the end position (maximum deflection position), the desired full deflection at maximum address voltage (=operating voltage), only a very low overlap (=immersion depth) of the static and moveable electrode planes of approximately 0% to 50% of the stroke (=deflection range between minimum and maximum address voltage) or of 10% to 40% or of 20% to 30% results. Therefore, a large part of the deflection range takes place with non-overlapping electrodes. The horizontal electrode gap is selected with 50% to 150% of the stroke or 60% to 100%, and the thickness of the electrodes (=expansion in deflection direction) is selected with 60% to 120% of the stroke or with 8% to 100%. Advantageously, the bias voltage can be in a range of 50% to 200% or of 80% to 150% of the address voltage range individual for the pixels.

The horizontal electrode gap is, for example, the medium or average (i.e., effective) horizontal (i.e., lateral) electrode gap of the first and second electrode structures in a plane parallel to a main surface area of the substrate. Accordingly, the vertical thickness of the first and second electrode structures is, for example, the medium or average (i.e., effective) thickness of the first and second electrode structures.

Based on the above design parameters for the MEMS actuator element, the maximum deflection $z_S$ (stroke) of the MEMS actuator element, which is desired or needed for the respective application can be obtained with small dimensions (pitch), a relatively low drive voltage and a (possibly) linear characteristic curve of the MEMS actuator element. The resulting maximum deflection path of the MEMS actuator element can hence be obtained in the size needed by the application by maintaining the boundary parameters (small dimensions, small drive voltage and linear characteristic curve), wherein typical applications for the MEMS actuator element can, for example, be scanner mirrors, optical switches for coupling optical fibers, microvalves, electric microswitches or spatial light modulators. For spatial light modulators, the MEMS actuator elements are frequently configured as two-dimensional array and move or position micromirrors mechanically connected therewith.

In contrary to conventional technology, where the maximum range of the stroke is between the minimum deflection position in the voltage-free state (or at a mechanical stop) and the maximum deflection position with a maximum or symmetrical overlap of the first and second electrode structures (also: symmetrical immersion), according to embodiments of the present concept, a useful deflection path that is as large as possible (=the desired maximum deflection path specified by the respective case of application) can be obtained and adjusted by the defined design parameters of the MEMS actuator element, wherein the resulting MEMS actuator element can have minimum dimensions (pitch), minimum drive voltages with relatively low crosstalk to adjacent pixels and a high linearity of the characteristic curve in the entire deflection range of the MEMS actuator element for the case of application.

BRIEF DESCRIPTION OF THE DRAWINGS

Embodiments of the present invention will be detailed subsequently referring to the appended drawings, in which:

FIG. 1a is a schematic perspective view of a MEMS actuator element according to an embodiment;

FIG. 2b is the schematic partial cross-sectional view of FIG. 1b through two adjacent MEMS actuator elements 10 according to an embodiment;

DETAILED DESCRIPTION OF THE INVENTION

Figure 1B:
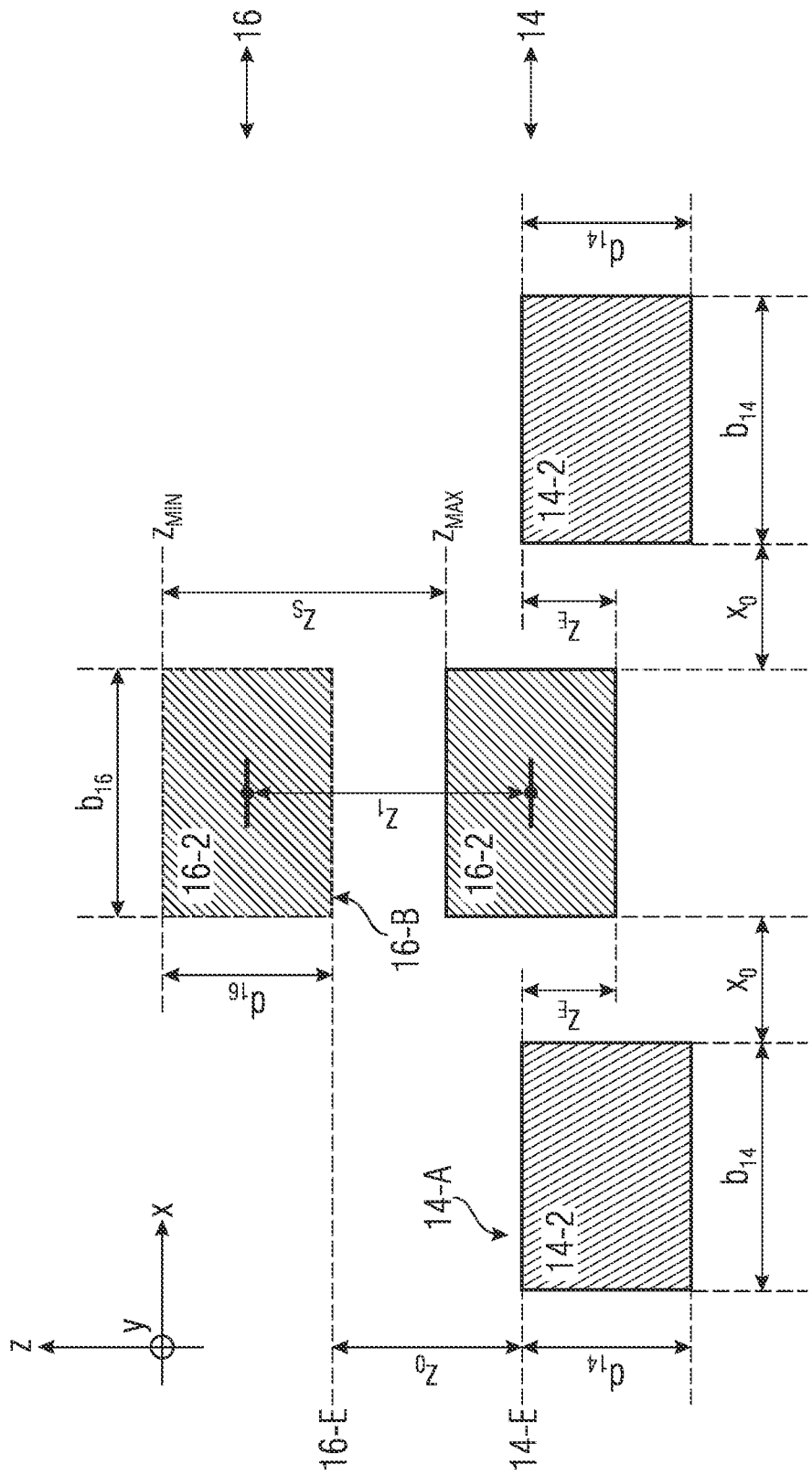
FIG. 1b is a schematic partial cross-sectional view through a portion of the edge structure of the first electrode structure and an opposite portion of the edge structure of the second electrode structure according to an embodiment.

Before embodiments of the present concept will be discussed in more detail below based on the drawings, it should be noted that identical, functionally equal or equal elements, objects, functional blocks and/or method steps are provided with the same reference numbers in the different figures, such that the description of these elements, objects, functional blocks and/or method steps illustrated in the respective embodiments is inter-exchangeable or inter-applicable.

Different embodiments will now be described in detail with reference to the accompanying drawings, where some embodiments are illustrated. In the figures, dimensions of illustrated elements layers and/or areas might not be to scale for illustrating purposes.

It is obvious, when an element is referred to as being "connected" or "coupled" to another element, the same can be connected or coupled directly to the other element or intermediate elements can exist. When, in contrary, an element is referred to as being "directly", "connected" or "coupled" to another element, no intermediate elements exist. Other terms used for describing the relationship between elements are to be interpreted similarly (e.g., "between", compared to "directly between", "adjacent" compared to "directly adjacent", etc.).

For simplifying the description of the different embodiments, the figures have a Cartesian coordinate system, x, y, z, wherein the x-y-plane corresponds to the main surface area of the carrier or substrate or is parallel to the same, and wherein the vertical direction is perpendicular to the x-y plane. In the following description, the term "lateral" or "horizontal" means a direction in the x-y plane (or parallel thereto) wherein the term "vertical" indicates a direction in the ±z direction (or parallel thereto).

The following examples relate to microelectromechanical systems (MEMS) that are configured to deflect a movable electrode structure that can be mechanically coupled to a functional element. Although subsequent embodiments relate to moveable functional elements including a mirror, in particular a micromirror, any other functional elements can be arranged, both in the optical area, such as lenses, filter or the same, but also in other fields such as for producing an electric contact or changing a mechanical distance.

MEMS can be produced in semiconductor technology, wherein here in particular multilayer arrangements are considered, including conductive, insulating or semi-conductive layers that can be spaced apart by the same layers or air gaps. MEMS can, for example, be obtained by a multilayer structure, which is reduced by selectively removing stack material, such as by an etching process, to expose MEMS structures. A silicon material, such as monocrystalline silicon, polycrystalline silicon or a doped silicon material can be used as a substrate. In different layers, conductivity can be generated, for example, to provide the functionality of an electrode. Other layers can, for example, be metalized such as to produce a reflecting surface and/or an electrically conductive surface.

In the following, an exemplary configuration of a MEMS actuator element 10 according to an embodiment will be discussed with reference to FIGS. 1*a-b*.

FIG. 1*a* shows a schematic perspective view of the MEMS actuator element 10 according to an embodiment, while FIG. 1*b* shows a schematic partial cross-sectional view along an intersection A-A in FIG. 1*a* and parallel to the x-z plane through a portion of the edge structure 14-1 of the first electrode structure 14 and an opposite portion of the edge structure 16-1 of the second electrode structure 16.

The MEMS actuator element 10 includes a substrate 12, for example a complete wafer or semi conductive wafer or alternatively a partly or completely singulated portion of the wafer. The substrate 12 can form a main surface area 12-A parallel to the substrate plane (parallel to the x-y plane) and extended at least partly in the substrate plane. The substrate plane is, for example, arranged parallel to a main side 12-A of a wafer (not shown in FIG. 1*a*), which can simply be referred to as upper side or bottom side, without these terms having any limiting effect, as terms like upper, bottom left, right, front, rear and the same are variable or exchangeable based on a variable orientation of the MEMS actuator element 10 in space.

Further, the MEMS actuator element 10 includes a first electrode structure 14 with an edge structure 14-1, wherein the first electrode structure 14 with the edge structure 14-1 is stationary with respect to the substrate 12. The first electrode structure 14 with the edge structure 14-1 can be arranged directly on the main surface area 12-*a* of the substrate 12.

Further, the MEMS actuator 10 includes a second electrode structure 16 with an edge structure 16-1, wherein the second electrode structure 16 is deflectably coupled to the substrate 12 by means of a spring structure 18 and is electrostatically deflectable by means of the first electrode structure 14 to move the edge structure 16-1 of the second electrode structure 16 into an intermediate position or deflection position $z_1$ between a minimum deflection position $z_{MIN}$ and a vertically spaced-apart maximum deflection position $z_{MAX}$, wherein the minimum and maximum deflection positions $z_{MIN}$, $z_{MAX}$ specify a maximum deflection path or stroke $z_S$ (see also FIG. 1*b*). The maximum stroke $z_S$ can represent a fixed amount size of the MEMS actuator element 10 needed by the respective actuator application.

In the MEMS actuator element 10, the edge structures 14-1, 16-1 of the first and second electrode structure 14, 16 are configured to be opposite to each other with respect to a top view, e.g., at a lateral distance $x_0$ and are spaced apart from one another vertically at the minimum deflection position $z_{MIN}$, e.g., in a vertical distance $z_2$ (see also FIG. 1*b*).

The lateral distance $x_0$ relates (in a top view) to laterally opposite portions of the edge structures 14-1, 16-1 of the first and second electrode structures 14, 16, while the vertical distance $z_0$ relates to vertically offset opposite edge planes 14-E, 16-E of the edge structures 14-1, 16-1 of the first and second electrode structures 14, 16. Here, the border plane 14-E of the first electrode structure 14 extends along the upper main surface area 14-A of the first electrode structure 14, wherein the border plane 16-E of the second electrode structure 16 extends along the bottom main surface area 16-B of the second electrode 16 (see also FIG. 1b).

In the MEMS actuator element 10, in the maximum deflection position $z_{MAX}$, the vertical immersion path "$z_E$" (or overlap or vertical overlap) of the edge structure 16-1 of the second electrode structure 16 into the edge structure 14-1 of the first electrode structure 14 is up to 0.5 times the maximum deflection path $z_S$, i.e., $z_E \leq 0.5\ z_S$.

In the following reference is first made to the embodiment of the MEMS actuator element 10 illustrated in FIG. 1a-b where the second electrode structure 16 is translatory deflectable with respect to the first electrode structure 14.

As shown exemplarily in FIG. 1a, the spring structure 18 can have two poles or substrates extensions 18-1 wherein one spring element 18-2 is arranged between the two poles 18-1, i.e., clamped between the two poles 18-1 or supported on the same and hence forms a spring element 18-2 clamped on both sides. Further, a connecting element 18-3 is arranged on the spring element 18-2, which is mechanically connected to the second electrode structure 16. The spring element 18-2 adjusts a spring force counteracting, for example, the electrostatically effected deflection of the second electrode structure 16 vertically (in −z-direction) to the first electrode structure 14.

Thus, embodiments relate to micromechanical actuators 10 that are controlled electrostatically, e.g., with a bias voltage $U_{BIAS}$ and that have a restoring elastic suspension 18 applying a respective counterforce for static balance deflection in order to bring the second electrode structure 16 into the minimum deflection position $z_{MIN}$.

Further, the MEMS actuator element 10 can comprise a functional element 20 that is mechanically firmly coupled also to the second electrode structure 16 by means of the connecting element 18-3. The functional element 20 can be an element whose translatory and/or rotatory position can be adjusted, controlled or at least influenced by the electrostatic deflection between the first and second electrode structures 14, 16. The functional element 20, for example, can be a micromirror and/or an electrically conductive structure.

According to an embodiment, the connecting element 18-3 can be mechanically coupled to the functional element 20 at a centroid of the same, wherein the connecting element 18-3 can further be mechanically coupled to the second electrode structure 16 at a centroid of the same. This symmetrical arrangement is only exemplarily, wherein other configurations can be selected as will be illustrated in the following embodiments.

As further illustrated exemplarily in FIG. 1a, the edge structure 16-1 of the second electrode structure 16 can be configured, with respect to a top view (and parallel to the x y plane), to engage the edge structure 14-1 of the first electrode structure 14. In that way, the edge structure 14-1 of the first electrode structure 14 can comprise a finger or comb structure, wherein the edge structure 16-1 of the second electrode structure 16 can comprise a further opposite finger or comb structure.

In this case, for example, this is referred to as "comb drive" that is formed by the first and second electrode structures 14, 16.

However, in this context, it should be noted that the term "comb drive" is not to be considered in a limiting sense, since also only a few finger or comb elements 14-2, 16-2 can be used for the first and/or second electrode structures 14, 16.

Further, according to the present functional principle, the first and/or second electrode structure 14, 16 can be used as edge elements without finger or comb elements, wherein the first and second electrode structures 14, 16 function equally according to the basic principles described herein. In that way, for example, the first electrode 14 can be configured as a circumferential structure to the second electrode structure 16 in a top view (and parallel to the x-y plane). Generally, this can also be referred to as an electrostatic edge actuator element, as the actuator force is proportional to the length of the opposite edge structures 14-1, 16-1 of the first and the second electrode structures 14, 16.

As far as the producible structure sizes allow, a finger or comb structure for the edge structure 14-1, 16-1 of the first and second electrode structure 14, 16 can be more effectively used, wherein in FIG. 1a, according to an embodiment, the MEMS actuator element 10 comprises first and second electrode structures 14, 16 having only a few finger elements 14-2, 16-2, such that the resulting MEMS actuator elements 10 can be densely arranged in the substrate plane and can have pixel sizes of approximately only around 8 to 16 times the minimum structure size. Generally, the value of the smallest structure that can be reliably produced photolithographically is referred to as minimum structure size.

FIG. 1b shows a schematic partial cross-sectional view along the intersection line A-A in FIG. 1a and parallel to the x-z plane through a portion of the edge structure 14-1 of the first electrode structure 14 and a vertically opposite portion of the edge structure 16-1 of the second electrode structure 16 according to an embodiment. Based on the illustration in FIG. 1b of the portions or finger elements 14-2, 16-2 of the edge structures 14-1, 16-1 of the first and second electrode structures 14, 16, both the relative positions and deflection paths of the edge structures 14-1, 16-1 of the first and second electrode structures 14, 16 of the MEMS actuator element 10 to one another as well as typical dimensions of the edge structures 14-1, 16-1 of the first and second electrode structures 14, 16 will be discussed.

Thus, FIG. 1b shows two individual finger elements 14-2 of the edge structure 14-1 of the first electrode structure 14 and a finger element 16-2 of the edge structure 16-1 of the second electrode structure 16 moving relative thereto. The arrangement or finger elements 14-2, 16-2 of the edge structures 14-1, 16-1 illustrated in FIG. 1b can be periodically continued (at least in portions) to form the circumferential edge structures 14-1, 16-1 of the first and second electrode structures 14, 16.

As illustrated exemplarily in FIG. 1b, the finger elements 14-2 of the first electrode structure 14 have a vertical thickness $d_{14}$ (in z direction) and a lateral width $b_{14}$. The finger element 16-2 of the second electrode structure 16 has a vertical thickness $d_{16}$ and a lateral (horizontal) width $b_{16}$. The dotted illustration of the finger element 16-2 illustrates, for example, a minimum deflection position (base position) $z_{MIN}$ of the second electrode structure 16 while the continuously drawn outline of the finger structure 16-2 of the second electrode 16 illustrates the maximum deflection position $z_{MAX}$ of the second electrode structure 16.

In the minimum deflection position $z_{MIN}$, the edge structures 14-1, 16-1 of the first and second electrode structures 14, 16 are vertically (=parallel to the z direction) spaced apart at a distance $z_0$, wherein in the maximum deflection position $z_{MAX}$ the finger element 16-2 of the second electrode structure 16 is vertically "immersed" between the two finger elements 14-2 of the first electrode structure. In the MEMS actuator element 10, in the maximum deflection position $z_{MAX}$, the vertical immersion path "$z_E$" (or overlap) of the edge structure 16-1 of the second electrode structure 16 into the edge structure 14-1 of the first electrode structure 14 is up to 0.5 times the maximum deflection path $z_S$, i.e., $z_E \leq 0.5 \, z_S$. The distance between the minimum deflection position $z_{MIN}$ and the maximum immersion positon $z_{MAX}$ is referred to as maximum deflection path or stroke $z_S$ and extends along the deflection positions or deflection intermediate positions $z_1$ with $0 \leq z_1 \leq z_S$, wherein the different deflection positions or deflection intermediate positions $z_1$ (between $z_{MIN}$ and $z_{MAX}$) are indicated as a dotted line. In the MEMS actuator element 10, the edge structures 14-1, 16-1 of the first and second electrode structure 14, 16 are configured to be opposite to each other with respect to a top view at a lateral distance $x_0$.

According to an embodiment, the MEMS actuator element 10 can comprise a micromirror element as the functional element 20, which is coupled to the second electrode structure 16. In applications for visible light, the following dimensions of the MEMS actuator element 10 may be present, for example, for a minimum structure: $z_S=320$ nm, $z_E=z_S/4=80$ nm, $z_0=z_S-z_E=240$ nm, $z_0=0.8 \, z_S \approx 250$ nm, $d_{14}=d_{16}=0.9 \, z_S \approx 300$ nm, $b_{14}=b_{16}=400$ nm. These values are to be considered as merely exemplarily and can vary depending on the field of application of the MEMS actuator element 10. These exemplary values can vary, depending on the field of application of the MEMS actuator element 10, for example by a common factor of 0.5 to 2, with 160 nm $\leq z_S \leq$ 640 nm or by a common factor of 0.8 to 1.2 with 256 nm $\leq z_S$ 384 nm.

Thus, according to an embodiment, the first and second electrode structures 14, 16 are configured to electrostatically deflect the second electrode structure 16 into an intermediate position $z_1$ between the minimum deflection position $z_{MIN}$ and the maximum deflection position $z_{MAX}$, based on an electric control voltage $V_S$. Here, a minimum value of the control voltage $V_S$ effects positioning or deflection of the edge structure 16-1 of the second electrode structure 16 into the minimum deflection position $z_{MIN}$, and the maximum value of the control voltage $V_S$ effects a deflection of the edge structure 16-1 of the second electrode structure 16 into the maximum deflection position $z_{MAX}$. The control voltage range (=address voltage range) is between the minimum value $V_{S\_MIN}$ of the control voltage $V_S$ and the maximum value $V_{S\_MAX}$ of the control voltage $V_S$.

Further, a change of the control voltage $V_S$ into a voltage value between the minimum control voltage $V_{S\_MIN}$ and the maximum control voltage $V_{S\_MAX}$ effects a respective change of the intermediate position $z_1$ of the edge structure 16-1 of the second electrode structure 16 between its minimum and maximum deflection position $z_{MIN}$ and $z_{MAX}$.

Further, according to an embodiment the MEMS actuator element 10 can comprise control means 22 for providing the control voltage $V_S$ between the first and second electrode structures 14, 16 of the MEMS actuator element 10. The control means 22 can, for example, be integrated in the semiconductor material of the substrate 12 or can also be arranged externally of the substrate 12 and can be connected electrically to the first and second electrode structures 14, 16. According to an embodiment, the control voltage $V_S$ can comprise a bias portion (a bias voltage) $V_{BIAS}$ and an operating voltage portion $V_{OPERATION}$.

Depending on the structure and dimensioning of the elements of the MEMS actuator element 10 and in particular the spring structure 18, different fixed values can be selected for the bias voltage $V_{BIAS}$, i.e., the minimum control voltage. If, for example, the bias voltage $V_{BIAS}$ is selected to be 0 V ($V_{BIAS}$=0 V), the minimum deflection position $z_{MIN}$ corresponds to the voltage-free resting position of the second electrode structure 16 with respect to the first electrode structure 14. If, for example, the bias voltage $V_{BIAS}$ is selected to be unequal 0 V ($V_{BIAS} \neq 0$ V), the minimum deflection position $z_{MIN}$ of the second electrode structure 16 differs from the first electrode structure 14 from the voltage-free resting position. As will be discussed in more detail below, applying a fixed (=constant) bias voltage $V_{BIAS}$ unequal 0 can provide for increased linearity of the deflection characteristic curve of the MEMS actuator element 10 over the control voltage $V_S$, in particular in the area of relatively low deflections $z_1$ from the resting position (=minimum deflection positon $z_{MIN}$).

According to an embodiment, the MEMS actuator element 10 can be configured such that in the maximum deflection position $z_{MAX}$ the vertical immersion path $z_E$ of the edge structure 16-1 of the second electrode structure 16 with respect to the edge structure 14-1 of the first electrode structure 14 is up to 0.5 times the maximum deflection path $z_S$, i.e., $z_E \leq 0.5 \, z_S$. According to an embodiment, the vertical immersion path $z_E$ can further be between 0.1 and 0.4 times or between 0.2 and 0.3 times the maximum deflection path $z_S$.

According to an embodiment, the MEMS actuator element 10 can further be configured such that the first and second electrode structures 14, 16 are spaced apart by a lateral minimum distance $x_0$ in a plane parallel to the substrate 12, wherein the lateral minimum distance $x_0$ is 0.5 to 1.5 times or 0.6 to 1 time the maximum deflection path $z_S$.

According to an embodiment, the MEMS actuator element 10 can further be configured such that the vertical thickness $d_{14}$, $d_{16}$ of the first and/or second electrode structure 14, 16 is 0.6 to 1.2 times or 0.8 to 1.0 times the maximum deflection path $z_S$.

Figure 3:
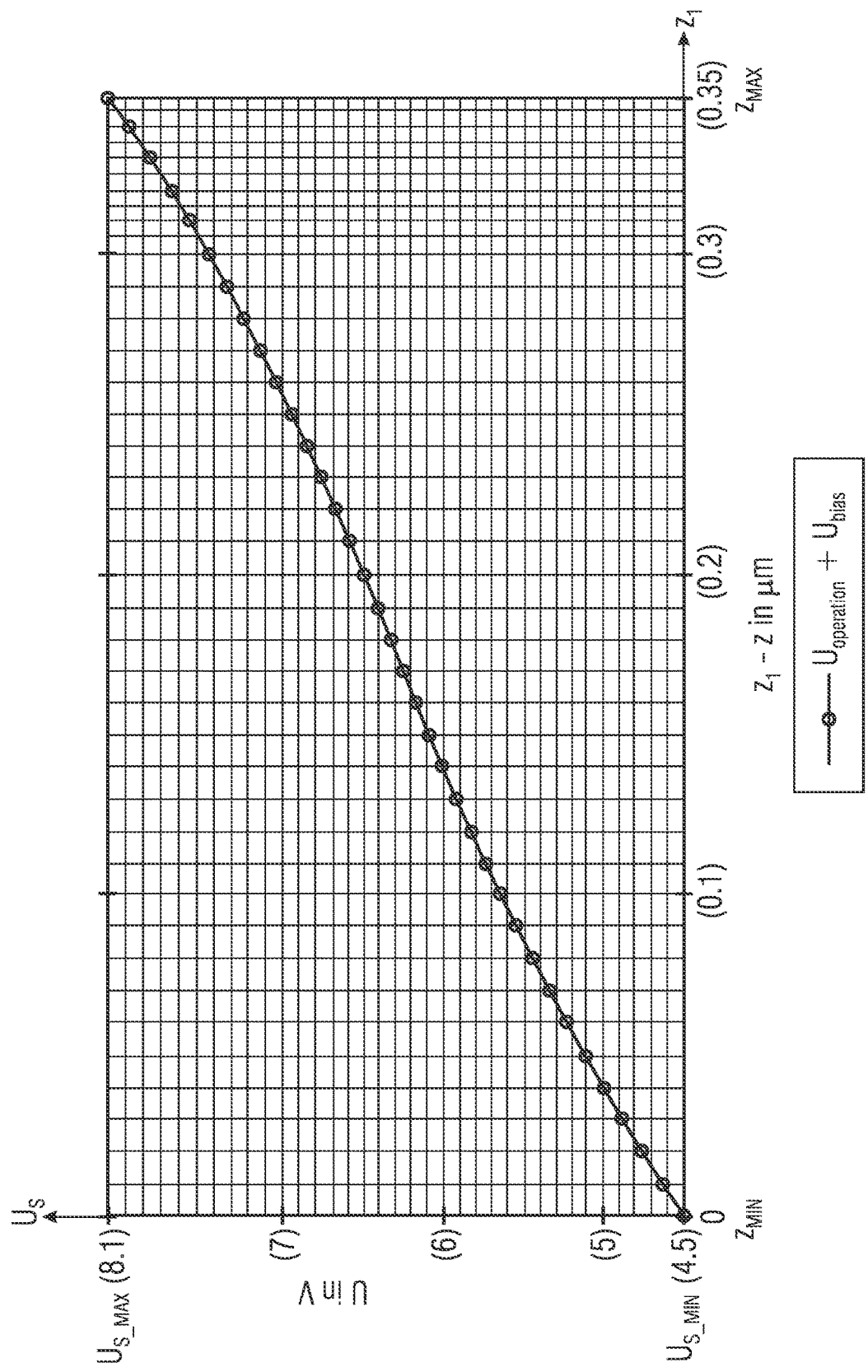
FIG. 3 is a schematic resulting characteristic curve of the deflection to the control voltage of a MEMS actuator element according to an embodiment.

According to an embodiment, the MEMS actuator element 10 can further be configured such that the minimum control voltage is provided as bias voltage $U_{BIAS}$, wherein the electric control voltage $V_S$ comprises the bias voltage $U_{BIAS}$ and the operating voltage (address voltage) $V_{OPERATION}$, wherein the bias voltage $V_{BIAS}$ can be in a range between 0.5 times to 2 times or 0.8 times to 1.5 times the operating voltage range (see also FIG. 3).

In comb drives or edge drives according to the described embodiments by the relatively small electrode gap, the electrostatic field can be limited in a spatially narrow range within the area of the electrode fingers 14-2, 16-2. Thereby, relatively high actuator forces can be obtained, even with the production-related minimum size of the electrode structures 14, 16 having only few finger elements 14-2, 16-2. For this, the described comb or edge drive allows low crosstalk between adjacent actuators 10.

According to an embodiment, the electrode structure can be placed at the edge of the pixel 10 with the common potential $U_{BIAS}$ of all pixels or actuators 10. When this is the stationary electrode structure 14, the same can be connected directly to the stationary electrode structure 14 of the adjacent pixel (not shown in FIG. 1a) as in FIG. 1a, which results in very low space requirements.

Regarding the illustration of FIG. 1a, it should be noted that here slightly more than the unit cell or the pixel 10 is shown, which can be densely arranged in a square or rectangular grid. For this, the unit cell or the pixel 10 can be configured in a rectangular or square manner. Here, the poles 18-1 of diagonally adjacent pixels 10 coincide. In the pixel outlines or pixel base areas that are configured in a relatively small manner, for example, only relatively few finger elements 14-2, 16-2 can be arranged according to the minimally producible structure resolution.

For linearization of the deflection characteristic curve with respect to the control signal $V_S$ with tolerable loss of maximum actuator force, particularly good overall results can be obtained when the design parameters are optimized as follows (depending on the weighting of the different target parameters for the desired design and the desired functionality of the MEMS actuator elements 10): In the end position (=maximum deflection position), the desired full deflection at maximum address voltage (=operating voltage), only a small overlap (=immersion depth) of the static and movable electrode planes of approximately 0% to 50% of the stroke (=deflection range between minimum and maximum address voltage) or of 10% to 40% or of 20% to 30% results. Thus, a large part of the deflection range takes place with non-overlapping electrodes. The horizontal electrode gap is selected with 50% to 150% of the stroke or 60% to 100% and the thickness of the electrodes (=expansion in deflection direction) is selected with 60% to 120% of the stroke or of 80% to 100%. The bias voltage can advantageously be in the range of 50% to 200% or of 80% to 150% of the address voltage range that is individual for the pixel. The horizontal electrode gap of 50% to 150% or of 60% to 100% of the stroke $z_S$ is here, for example, the medium or average (i.e., effective) horizontal (lateral) of the first and second electrode structures in a plane parallel to a main surface area of the substrate. Accordingly, the vertical thickness of the first and second electrode structures is here the medium or average (i.e., effective) thickness of the first and second electrode structures and is, for example, 60% to 100% or 80% to 100% of the stroke.

Based on the above design parameters for the MEMS actuator element, the maximum deflection $z_S$ (stroke) desired or needed for the respective application can be adjusted, wherein for this size of the maximum deflection requested or specified by the application a MEMS actuator element can be obtained having dimensions (pitch) optimized (=minimum) for the respective application case, an optimized (=minimum) drive voltage, a linear characteristic curve and low crosstalk to adjacent MEMS actuator elements.

Figure 2A:
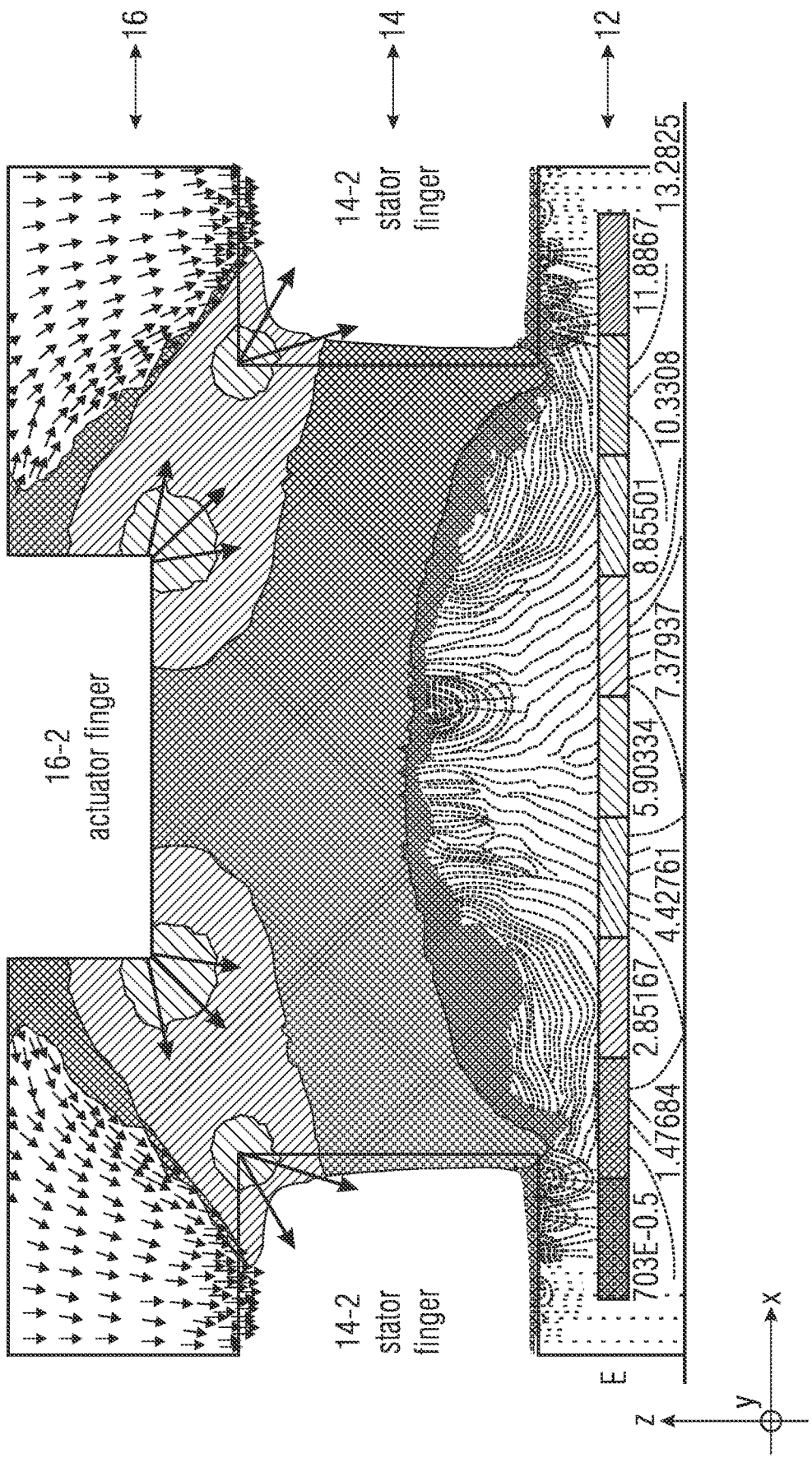
FIG. 2a is the schematic partial cross-sectional view of FIG. 1b with a resulting concentration of the electric field between the edge structure of the first electrode structure and an opposite portion of the edge structure of the second electrode structure.

FIG. 2a shows the schematic partial cross-sectional view of FIG. 1b of the MEMS actuator element 10 having a typical resulting concentration of the electric field E between two finger elements (stator fingers) 14-2 of the edge structure 14-1 of the first electrode structure (stator) 14 and an opposite finger element (actuator finger) 16-2 of the edge structure 16-1 of the second electrode structure (actuator) 16 of the MEMS actuator element 10. The schematic partial cross-sectional view can be periodically continued to obtain the first and second electrode structures 14, 16. As can be seen from FIG. 2a, the main portion of the electrode field is between the finger elements 14-2 and 16-2, such that the area of high field strength is concentrated to a small spatial area. The low field strength of the electric field in the outside space results in low crosstalk to adjacent MEMS actuator elements 10.

FIG. 2b shows the schematic partial cross-sectional view of FIG. 1b by two adjacent MEMS actuator elements 10 with only little crosstalk (arrow A) by a large gap between the second electrode structures 14 of the adjacent MEMS actuator elements 10, wherein the main portion of the electric field (arrow B) is between the finger elements 14-2 and 16-2.

FIG. 3 shows a schematic resulting characteristic curve of the deflection $z_1$ to the control voltage $V_S$ of a MEMS actuator element 10 according to an embodiment.

That way, a change of the control voltage $V_s$, with $V_S=V_{BIAS}+V_{BETRIEB}$, in a voltage value between the minimum control voltage $V_{s\_min}$ and the maximum control voltage $V_{s\_max}$, effects a respective change of the intermediate position $z_1$ of the edge structure 16-1 of the second electrode structure 16 between its minimum and maximum deflection positions $z_{min}$ and $z_{max}$.

In FIG. 3, merely exemplarily values are indicated for the minimum control voltage $V_{s\_min}$ and the maximum control voltage $V_{s\_max}$ of the control voltage $V_s$ as well as for the respective intermediate positions or deflection positions $z_1$ of the edge structure 16-1 of the second electrode structure 16 between its minimum and maximum deflection position $z_{min}$ and $z_{max}$.

Here, the overlap in the end position (i.e., the vertical immersion path $z_E$ of the edge structure 16-1 of the second electrode structure 16 with respect to the edge structure 14-1 of the first electrode structure 14) provides for a large maximum actuator force between the first and second electrode structures 14, 16, wherein the small amount of the overlap $z_E$ and the not too small horizontal gap $x_0$ again provide for moderate horizontal forces between the first and the second electrode structures 14, 16, e.g., in case of manufacturing inaccuracies. The limited electrode thickness $d_{14}$, $d_{16}$ of the first and second electrode structures 14, 16 has the effect that the actuator force for a given control voltage $v_s$ even decreases with increasing deflection $z_1$, since the actuator force in the theoretical symmetrical position ($z_E=d_{14}$) with completely immersed electrode structures 14, 16 is necessarily zero, wherein the characteristic curve for large control voltages $V_S$ does not become as steep as otherwise common in electrostatic actuators. The theoretical symmetrical position (with $z_E=d_{14}$) is not obtained according to embodiments, since according to embodiments the vertical immersion path "$z_E$" (or overlap) of the edge structure 16-1 of the second electrode structure 16 into the edge structure 14-1 of the first electrode structure 14 is up to 0.5 times the maximum deflection path $z_S$, i.e., $z_E \leq 0.5\ z_S$. Thereby, linearization of the deflection characteristic curve (i.e., the actuator position or deflection vs. address voltage) in the range of large deflections $z_1$ is obtained. Finally, the bias voltage $V_{BIAS}$ provides for improved linearity in the area of low deflections.

As shown exemplarily in FIG. 3, the electric control voltage $V_S$ can be in a range of approximately 4.5 to 8.1 volts for the selected or adjusted maximum deflection path $z_s$ (stroke). Thus, the minimum control voltage $V_{S\_min}$ is provided as bias voltage $V_{BIAS}$ of 4.5 V. Thus, the electric control voltage $V_S$ comprises the bias voltage $V_{BIAS}$ and an operating voltage $V_{OPERATION}$, wherein, according to FIG. 3, for example, the operating voltage range comprises 3.6 Volts ($V_{S\_MAX}-V_{S\_MIN}=8.1-4.5$ Volts). Depending on the application case and resulting dimensions of the MEMS actuator element 10, these exemplarily values can vary, for example, by a factor of 0.3 to 3, of 0.5 to 2, or of 0.8 to 1.2.

Figure 4:
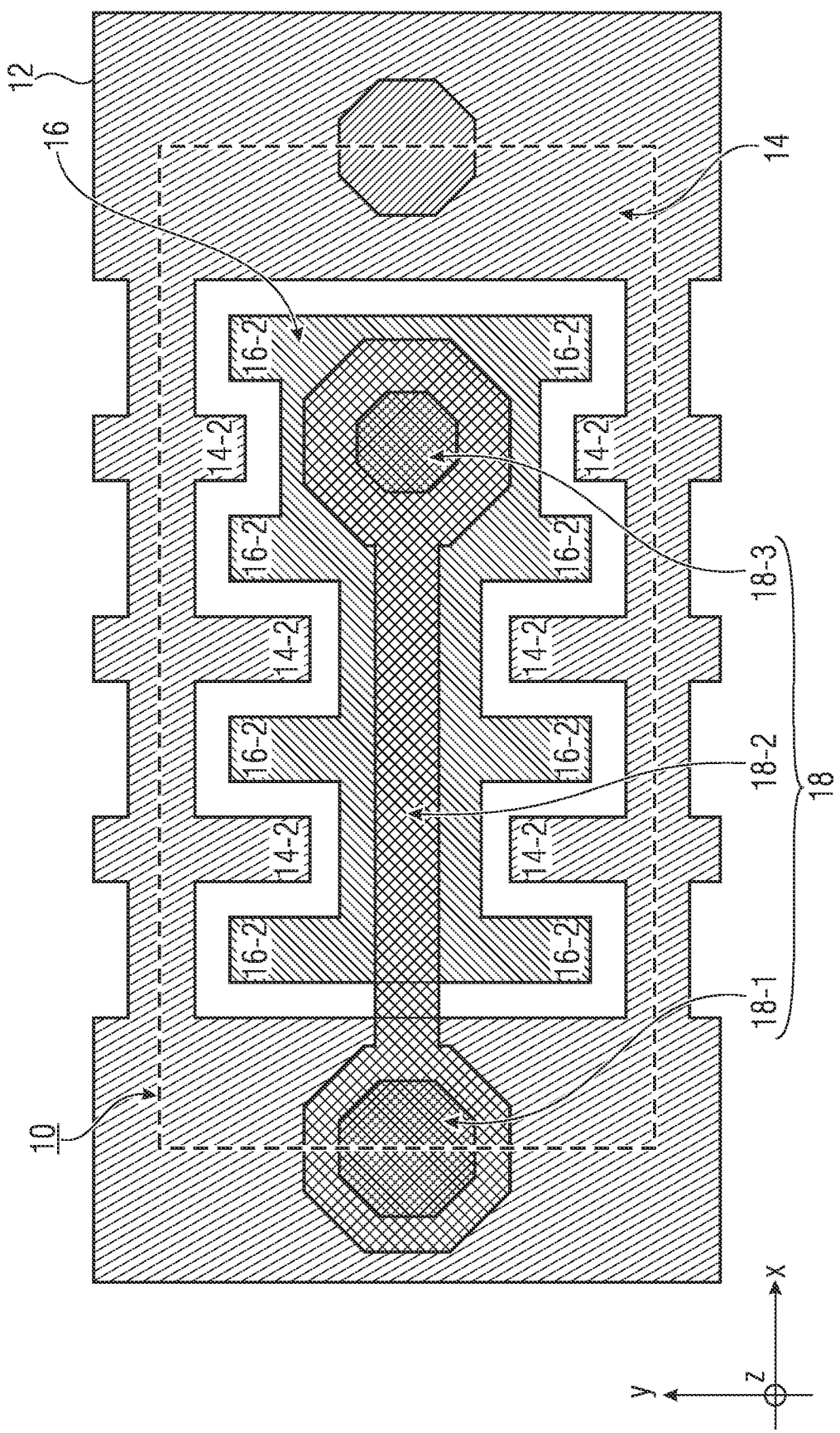
FIG. 4 is a schematic top view of a rectangular MEMS actuator element (unit cell for an array) with a cantilevered spring element (cantilever) of the spring structure according to an embodiment.

FIG. 4 shows a schematic top view of a rectangular MEMS actuator element, e.g., a unit cell for an array with a cantilevered spring element 18-2 (cantilever) of the spring structure 18 according to an embodiment.

According to the embodiment of FIG. 4, the connecting element 18-3 can be mechanically coupled to the functional element 20 at a connecting area differing from the centroid, wherein the connecting element 18-3 is further mechanically coupled to the second electrode structure 16. However, this asymmetrical arrangement is to be considered as being exemplarily.

In this context, it should be noted again that the term "comb drive" here (especially with regard to very small pixel 10) is to be seen as being very general, since also electrode structures 14, 16 having only a few finger elements 14-2, 16-2 or even electrode structures 14, 16 completely without finger elements operate according to the same principles.

Thus, according to the present functional principle, the first and/or second electrode structure 14, 16 can be used as edge elements without finger or comb elements, wherein the first and second electrode structures 14, 16 function equally according to the principles described herein. Thus, for example, the first electrode structure 14 can be configured as circumferential structure to the second electrode structure 16 in a top view (parallel to the x-y plane). Generally, this can also be referred to as electrostatic edge actuator element, as the actuator force is proportional to the length of the opposite edge structures 14-1, 16-1 of the first and second electrode structures 14, 16.

Providing finger elements 14-2, 16-2 can provide further advantages as long as the producible (minimum) structure sizes allow.

FIG. 4 shows an example for such a MEMS actuator element 10 with only a few finger elements 14-2, 16-2 that can be densely arranged in the substrate plane or parallel to the substrate plane and can have dimensions for the MEMS actuator element 10 (=pixel sizes) of about only eight to sixteen times the minimum structure size.

Figure 5A:
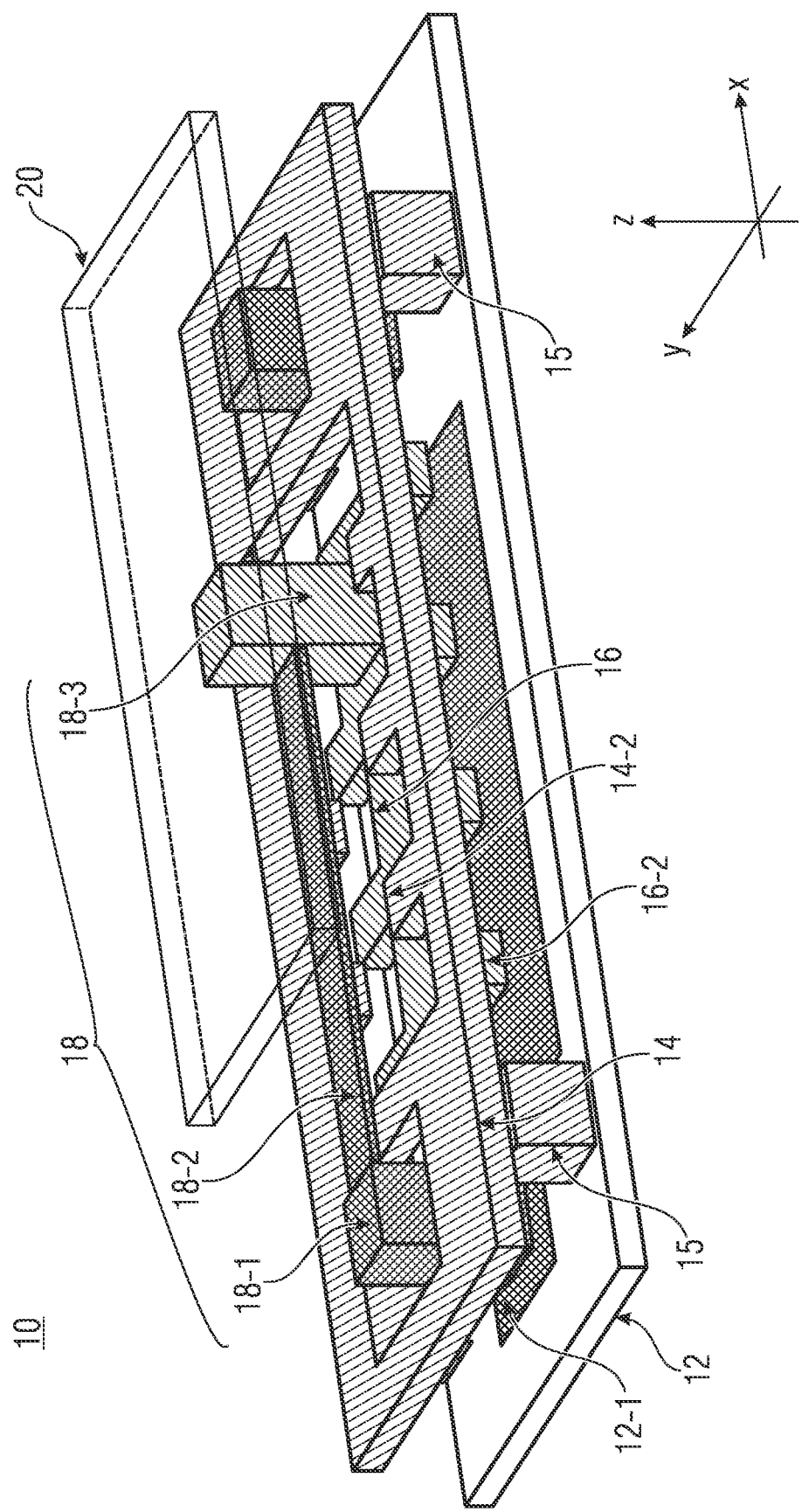
FIG. 5a is a schematic perspective view of a MEMS actuator element according to a further embodiment.
Figure 5B:
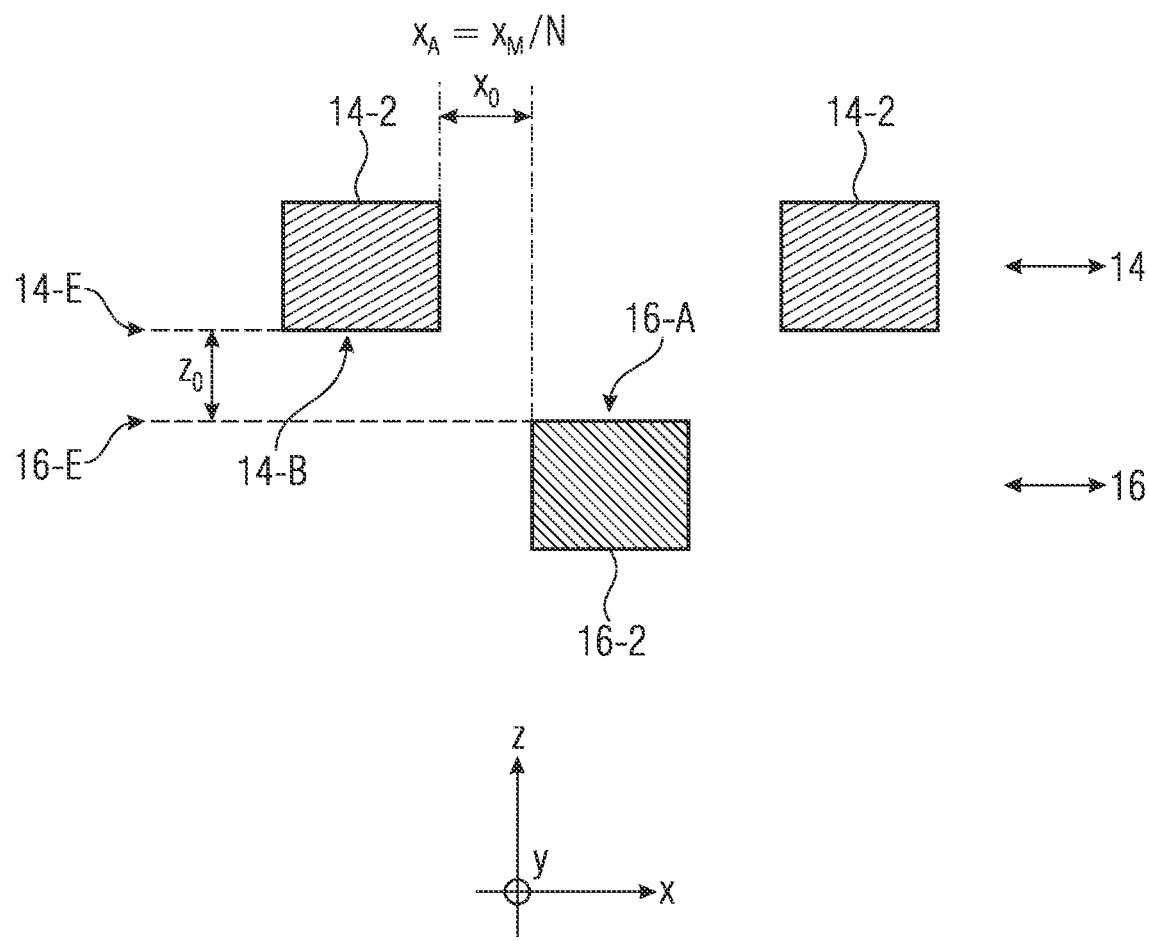
FIG. 5b is a schematic partial cross-sectional view through a portion of the edge structure of the first electrode structure and an opposite portion of the edge structure of the second electrode structure according to an embodiment.

FIG. 5a shows a schematic perspective view of a MEMS actuator element 10 according to a further embodiment. FIG. 5b shows a schematic partial cross-sectional view through two finger elements 14-2 of the first electrode structure 14 and an opposite finger element 16-2 of the second electrode structure 16 according to an embodiment.

The MEMS actuator element 10 includes again the first electrode structure 14 with an edge structure 14-1, wherein the first electrode structure 14 with the edge structure 14-1 is arranged stationary with respect to the substrate 12. The first electrode structure 14 with the edge structure 14-1 is arranged spaced apart from the main surface area 12-A of the substrate 12 by means of spacing elements 15. The spacing elements (spacer) 15 can be part of the first electrode structure 14 and/or the substrate 12.

The MEMS actuator element 10 comprises an upper first electrode structure (stator) 14 with the finger elements (stator fingers) 14-2 of the edge structure 14-1, wherein the second electrode structure (actuator) 16 with the finger element (actuator finger) 16-2 of the edge structure 16-1 (in the resting position $z_{min}$) is arranged vertically between the first electrode structure 14 and the substrate 12.

The lateral gap $x_0$ relates again (in top view) to laterally opposite portions of the edge structures 14-1, 16-1 of the first and second electrode structures 14, 16, while the vertical distance $z_0$ relates to vertically offset opposite border planes 14-E, 16-E of the edge structures 14-1, 16-1 of the first and second electrode structures 14, 16. Here, the border plane 14-E of the first electrode structure 14 extends along the bottom main surface area 14-B of the first electrode structure 14, wherein the border plane 16-E of the second electrode structure 16 extends along the upper main surface area 16-A of the second electrode structure 16.

Further, the MEMS actuator element 10 can comprise a conductive base plate 12-1 for shielding the influence of the underlying electronics (not shown). The conductive base plate 12-1 can be configured as part of the substrate 12. In contrary to the above embodiments, it can be advantageous to arrange the stationary electrode structure 14 (the stator) vertically above the moveable electrode structure 16, i.e., on the side facing away from the substrate 12 as illustrated in FIG. 5a.

Thus, FIG. 5a shows a further example for a MEMS actuator element 10 with only a few finger elements 14-2, 16-2 that can be arranged densely in the substrate plane or parallel to the substrate plane and can have dimensions for the MEMS actuator element 10 (=pixel sizes) of only about 8 to 16 times the minimum structure size.

Figure 6:
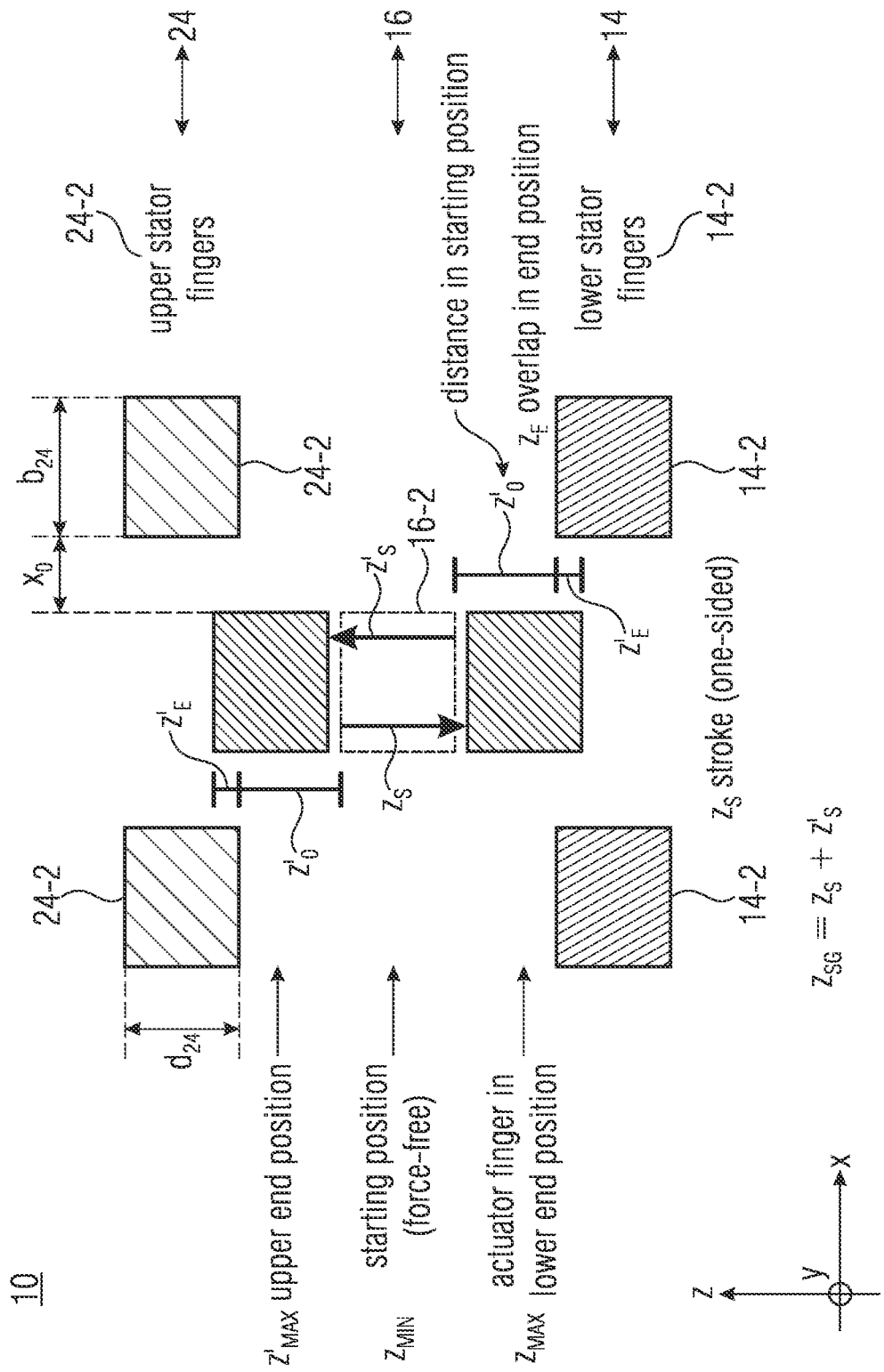
FIG. 6 is a schematic partial cross-sectional view through a part of a MEMS actuator element according to an embodiment, wherein the MEMS actuator element is configured as double-acting actuator.

FIG. 6 shows a schematic partial cross-sectional view through part or through some finger elements of a MEMS actuator element 10 according to an embodiment, wherein the MEMS actuator element 10 can be configured as double-acting actuator.

According to an embodiment, the MEMS actuator element 10 can comprise a third electrode structure 24 that is stationary with respect to the substrate 12, wherein the second electrode structure 16 is arranged (e.g., symmetrically) between the first and third electrode structures 14, 24 and is deflectable. Here, the second electrode structure 16 is electrostatically moveable by means of the first and third electrode structures 14, 24 from the minimum deflection position (=resting position) $z_{MIN}$ into a vertically spaced-apart further maximum deflection position (=upper maximum deflection position) $z_{MAX}$.

Thus, FIG. 6 shows two individual finger elements 14-2 of the edge structure 14-1 of the first electrode structure 14 and two individual finger elements 24-2 of the edge structure 24-1 of the third electrode structure 24 as well as a finger element 16-2 of the edge structure 16-1 of the second electrode structure 16 moving relative thereto. The arrangement of finger elements 14-2, 16-2, 24-2 of the edge structures 14-1, 16-1, 24-1 illustrated in FIG. 6 can be (at least in portions) periodically continued, which is in order to form the circumferential edge structures 14-1, 16-1, 24-1 of the first, second, and third electrode structures 14, 16, 24.

Regarding the geometric arrangement of the first and second electrode structures 14, 16, reference is made to the statements regarding FIG. 1b that are equally applicable herein.

As illustrated exemplarily in FIG. 6, the finger elements 14-2 of the first electrode structure 14 have again a vertical thickness $d_{14}$ (in the z direction) and a lateral width $b_{14}$. The finger element 16-2 of the second electrode structure 16 has a vertical thickness $d_{16}$ and a lateral (horizontal) width $b_{16}$. The finger elements 24-2 of the third electrode structure 24 have a vertical thickness $d_{24}$ (in the z direction) and a lateral width $b_{24}$. According to an embodiment, optionally, $d_{12}=d_{14}=d_{24}$ and $b_{12}=b_{14}=b_{24}$ can apply, wherein, however, other geometric proportions can be selected.

The dotted illustration of the finger element 16-2 indicates, for example, a minimum deflection position (base position or starting position) $z_{MIN}$ of the second electrode structure 16, while the continuously drawn (vertical) bottom finger structure 16-2 of the second electrode structure 16 illustrates the maximum deflection position $z_{MAX}$ (=bottom end position) of the second electrode structure 16 and the further continuously drawn (vertical) upper finger structure 16-2 of the second electrode structure 16 illustrates the further maximum deflection position $z'_{MAX}$ (=upper end position) of the second electrode structure 16.

In the minimum deflection position $z_{MIN}$, the edge structures 16-1, 24-1 of the second and third electrode structures 16, 24 are vertically (=parallel to the z direction) spaced apart at a distance $z'_0$, wherein in the further maximum deflection position $z'_{MAX}$, the finger element 16-2 of the second electrode structure 16 is vertically "immersed" between the two finger elements 24-2 of the third electrode structure. In the MEMS actuator element 10, in the further maximum deflection position the $z'_{MAX}$, the vertical immersion path $z'_E$ (or overlap) of the edge structure 16-1 of the second electrode structure 16 into the edge structure 24-1 of the third electrode structure 14 is up to 0.5 times the maximum deflection path $z'_S$, i.e., $z'_E \leq 0.5\, z'_S$. The distance between the resting position $z_{MIN}$ and the further maximum immersion position $z_{MAX}$ is referred to as further maximum deflection path or stroke $z'_S$, and extends along the deflection positions or deflection intermediate positions $z_1$. In the MEMS actuator element 10, the edge structures 16-1, 24-1 of the second and the third electrode structures 16, 24 are configured to be opposite to each other with respect to a top view at a lateral distance $x_0$.

The distance between the resting position $z_{MIN}$ and the maximum immersion position $z_{MAX}$, i.e., the maximum deflection path or stroke $z_S$ and the distance between the resting position $z_{MIN}$ and the further maximum immersion position $z'_{MAX}$, i.e., the further maximum deflection path or stroke $z'_S$, add up to the overall stroke $z_{SG}$ (with $z_{SG}=z_S+z'_S$).

According to an embodiment, the maximum deflection path $z_S$ and the further maximum deflection path $z'_S$ (within a tolerance range of ≤5% or 10%) can be the same, wherein smaller deviations and tolerances between $z_S$ and $z'_S$ do not affect the described functional principle of the MEMS actuator element 10.

Thus, according to an embodiment, the second and third electrode structures 16, 24 are configured to electrostatically deflect the second electrode structure 16 into the further intermediate position $z'_1$ between the minimum deflection position $z_{MIN}$ and the further maximum deflection position $z_{MAX}$ based on a further electric control voltage $V'_S$. Here, a minimum value of the control voltage $V'_S$ effects positioning or deflection of the edge structure 16-1 of the second electrode structure 16 into the minimum deflection position $z_N$ and a further maximum value of the control voltage $V'_S$ effects deflection of the edge structure 16-1 of the second electrode structure 16 into the further maximum deflection position $z'_{MAX}$. The further control voltage range (=address voltage range) is between the minimum value $V_{-MIN}$ of the control voltage $V'_S$ and the further maximum value $V'_{-MAX}$ of the control voltage $V'_S$.

Further, a change of the control voltage $V'_S$ in a voltage value between the minimum control voltage $V_{S\_MIN}$ and the further maximum control voltage $V'_{S\_MAX}$ effects a respective change of the further intermediate position $z'_1$ of the edge structure 16-1 of the second electrode structure 16 between its minimum deflection positon $z_{MIN}$ and the further maximum deflection position $z'_{MAX}$.

According to an embodiment, the MEMS actuator element 10 can further comprise the control means 22 for providing the further control voltage $V'_S$ between the second and third electrode structures 16, 24. According to an embodiment, the further control voltage $V'_S$ can comprise a bias portion (a bias voltage) $V_{BIAS}$ and a further operating voltage portion $V'_{OPERATION}$.

According to an embodiment, the MEMS actuator element 10 can be configured such that in the further maximum deflection position $z'_{MAX}$, the further vertical immersion path $z'_E$ of the edge structure 16-1 of the second electrode structure 16 with respect to the edge structure 24-1 of the third electrode structure 24 is up to 0.5 times the further maximum deflection path $z'_S$, i.e., $z'_E 0.5\, z'_S$. According to an embodiment, the further vertical immersion path $z'_E$ can further be between 0.1 and 0.4 times or between 0.2 and 0.3 times the further maximum deflection path $z'_S$.

According to an embodiment, the MEMS actuator element 10 can further be configured such that the second and third electrode structures 16, 24 are spaced apart by a lateral minimum distance $x_0$ in a plane parallel to the substrate 12, wherein the lateral minimum distance $x_0$ is 0.5 to 1.5 times or 0.6 to 1 times the further maximum deflection path $z'_S$.

According to an embodiment, the MEMS actuator element 10 can further be configured such that the vertical thickness d24 of the third electrode structure 24 is 0.6 to 1.2 times or 0.8 to 1.0 times the further maximum deflection path $z'_S$.

According to an embodiment, the MEMS actuator element 10 can further be configured such that the minimum control voltage is provided as a bias voltage $U_{BIAS}$, wherein the further electric control voltage $V'_S$ comprises the bias voltage $U_{BIAS}$ and the further operating voltage (address voltage) $V'_{OPERATION}$, wherein the bias voltage $V_{BIAS}$ can be in a range between 0.5 times to 2 times or 0.8 times to 1.5 times the further operating voltage range.

In comb drives or edge drives according to the described embodiments, by the relatively small electrode gap, the electrostatic field can be limited in a spatially narrow range within the area of the electrode fingers 14-2, 16-2, 24-2. Thereby, relatively high actuator forces can be obtained even in the production-related minimum size of the electrode structures 14, 16, 24 with only a few finger elements 14-2, 16-2, 24-2. Additionally, the described comb or edge drive allows low crosstalk between the adjacent actuators 10.

According to an embodiment, the electrode structure 14 or 16 can be positioned at the edge of the pixel 10 with the common potential $V_{BIAS}$ of all pixels or actuators 10. When this is the stationary electrode structure 14, the same can be connected directly to the stationary electrode structure 14, 24 of the adjacent pixel (not shown in FIG. 6), which results in very low space requirements.

The above explanations regarding the MEMS actuator element 10 of FIG. 6 illustrate that the present concept can be advantageously used even in double-acting actuators, wherein the moveable electrode structure 16 is opposed by stationary electrode structures 14, 24 in both directions (i.e., "above" and "below"). Thereby, each electrode structure 14, 24, has to be dimensioned only for half of the overall stroke $z_{SG}$, which can again greatly improve the maximum actuator force and the linearity. This can make up for the additional effort for the expensive production of the MEMS actuator element 10 of FIG. 6. Alternatively, here (as in all embodiments) the roles or functions of stationary and moveable electrode structures 14, 16 can basically be reversed.

As already stated above, according to embodiments, the MEMS actuator element 10 can be configured such that the second electrode structure 16 is deflectable in a translatory or rotatory manner (=tilting or rotating) with respect to the first electrode structure 14, that the second electrode structure 16 is deflectable in a translatory and rotatory manner with respect to the first electrode structure 14, that the second electrode structure 16 is deflectable in a translatory or rotatory manner with respect to the first and third electrode structures 14, 24 or that the second electrode structure is deflectable in a translatory and rotatory manner with respect to the first and third electrode structures 14, 24.

Figure 7:
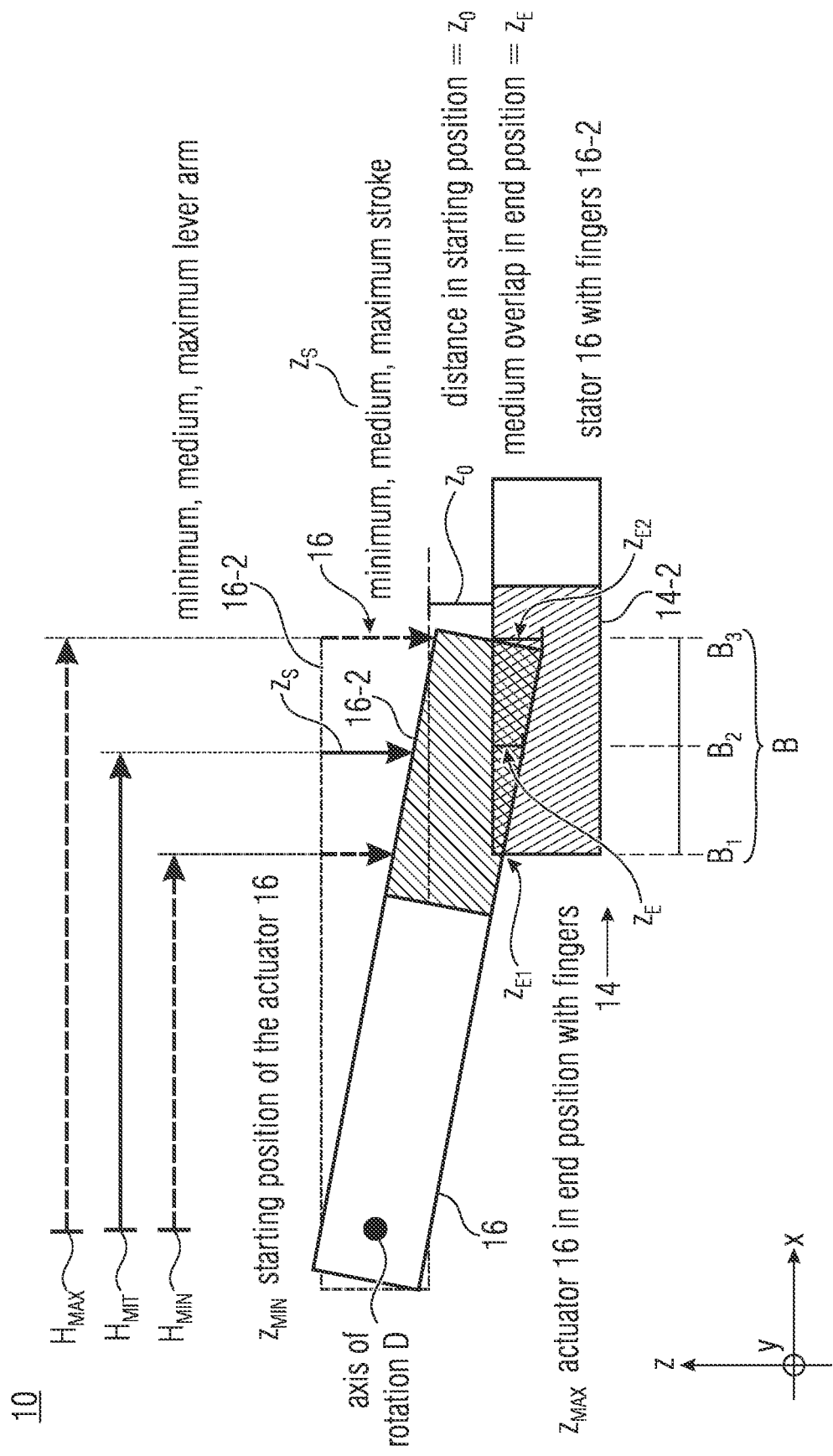
FIG. 7 is a schematic cross-sectional view perpendicular to a tilting axis through part of a MEMS actuator element according to an embodiment, wherein the MEMS actuator element is configured as tilting actuator.

FIG. 7 shows a schematic cross-sectional view perpendicular to a tilting axis or axis of rotation D through part of a MEMS actuator element 10 according to an embodiment, wherein the MEMS actuator element 10 is configured as tilting actuator (also rotating actuator).

Even when above different embodiments and the wording of the description relate to translatory MEMS actuator elements 10, e.g. with micro mirrors (lowering mirrors) deflecting in parallel, the present inventive concept is also suitable for other MEMS elements, specifically also MEMS actuator elements 10 without mirrors.

Also, rotatory MEMS actuator elements 10 (actuators) can be optimized in that manner, wherein the stroke $z_S$ defined for the translatory MEMS actuator elements 10, which can comprise, e.g., lowering mirrors, can be replaced by the average deflection of the edge structure(s) of the rotatory MEMS actuator element 10 weighted with the distance from the axis of rotation.

Further, the MEMS actuator element 10 includes the first electrode structure 14 with the edge structure 14-1 or the finger elements 14-2, wherein the first electrode structure 14 is stationary with respect to the substrate 12. The first electrode structure 14 can, for example, be arranged in a stationary manner directly on or also spaced apart from the main surface area 12-A of the substrate 12.

Further, the MEMS actuator element 10 includes a second electrode structure 16 with an edge structure 16-1 or finger elements 16-2, wherein the second electrode structure 16 is coupled in a deflectable manner to the substrate 12 by means of a spring structure 18 (not shown in FIG. 7) and is electrostatically deflectable by means of the first electrode structure 14 to move the finger elements 16-2 of the second electrode structure 16 by means of a tilting or rotating movement around an axis of rotation D into an intermediate position or deflection position $z_1$ between a minimum deflection position $z_{MIN}$ and a vertically spaced-apart maximum deflection position $z_{MAX}$, wherein the minimum and maximum deflection positions $z_{MIN}$, $z_{MAX}$ specify a maximum deflection path or stroke $z_S$.

In the MEMS actuator element 10, the edge structures 14-1, 16-1 of the first and second electrode structures 14, 16 are configured to be opposite to each other with respect to a top view, e.g., at a lateral distance $x_0$ and are vertically spaced apart in the minimum deflection position $z_{MIN}$, e.g., at a vertical distance $z_0$. Regarding the geometric dimensions of the first and second electrode structures 14, 16, reference is made to the statements regarding FIG. 1b that are equally applicable herein. In the minimum deflection position $z_{MIN}$, the lateral distance $x_0$ (in a top view) relates to laterally opposite portions of the edge structures 14-1, 16-1 of the first and second electrode structures 14, 16 while the vertical distance $z_0$ relates to vertically offset opposite planes of the edge structures 14-1, 16-1 of the first and second electrode structures 14, 16.

The spring structure (not shown in FIG. 7) can, for example, be configured as a torsion spring. Thus, embodiments relate again to MEMS actuator elements 10 that are controlled electrostatically, e.g., with a bias voltage and have a restoring elastic suspension applying a respective counter force for a static balance deflection in order to bring the second electrode structure 16 into the minimum deflection position $z_{MIN}$.

As shown exemplarily in FIG. 7, the finger elements 16-2 of the second electrode structure 16 can be configured to engage the finger elements 14-2 of the first electrode structure 14 with respect to a top view (and parallel to the x-y plane). In that way, the edge structure 14-1 of the first electrode structure 14 can comprise a finger or comb structure, wherein the edge structure 16-1 of the second electrode structure 16 can comprise a further opposite finger or comb structure.

This case is, for example, also referred to as a comb drive formed by the first and second electrode structures 14, 16. In that context, it should also be noted that the term "comb drive" is not to be considered in a limiting manner, since also for the first and/or second electrode structure 14, 16 only a few finger or comb elements 14-2, 16-2 can be used. Further, according to the present functional principle, the first and/or second electrode structure 14, 16 can be used as edge elements without finger or comb elements, wherein the first and second electrode structures 14, 16 function equally according to the principles described herein. In that way, for example, the first electrode structure 14 can be configured as a circumferential edge structure 14-1 to the second electrode structure 16 in a top view (parallel to the x-y plane). Generally, this can also be referred to as an electrostatic edge actuator element, as the actuator force is proportional to the length of the opposite edge structures 14-1, 16-1 of the first and second electrode structure 14, 16.

In that way, FIG. 7 shows a finger element 14-2 of the edge structure 14-1 of the first electrode structure 14 and a finger element 16-2 of the edge structure 16-1 of the second electrode structure 16 moving relative thereto. The arrangement of finger elements 14-2, 16-2 of the edge structures 14-1, 16-2 shown in FIG. 7 can be periodically continued (at least in portions) to form the edge structures 14-1, 16-1 of the first and second electrode structures 14, 16.

As illustrated exemplarily in FIG. 7, the dotted illustration of the second electrode structure 16 represents, for example, a minimum deflection position (base position) $z_{MIN}$ of the second electrode structure 16, while the continuously drawn contour of the second electrode structure 16 represents the maximum deflection position $z_{MAX}$ of the second electrode structure 16.

In the minimum deflection position $z_{MIN}$, the edge structures 14-1, 16-1 of the first and second electrode structures 14, 16 are vertically (=parallel to the z direction) spaced apart at a distance $z_0$, wherein in the maximum deflection position $z_{MAX}$, the finger element 16-2 of the second electrode structure 16 is vertically "immersed" between two finger elements 14-2 of the first electrode structure.

As illustrated in FIG. 7, a lateral finger overlap range B of the first and second electrode structure 16 results where the finger elements 14-2, 16-2 of the first and second electrode structures 16 engage in a top view (i.e., parallel to the x-y plane) and extend in parallel. The lateral finger overlap range B comprises starting point B1 (=start of the edge structure 14-1 of the finger element 14-2 of the first electrode structure 14), a center point B2 (=central position between the end of the edge structure 14-1 or the end of the finger element 14-2 of the first electrode structure 14 and the end of the edge structure 16-1 or the end of the finger element 16-2 of the second electrode structure 16) and an end point B3 (=end of the edge structure 16-1 or the finger element 16-2 of the second electrode structure 16).

Starting from the axis of rotation D of the second electrode structure 16, a minimum level arm $H_{MIN}$ of the second electrode structure 16 extends to the starting point B1 of the lateral finger overlap range B. Starting from the axis of rotation D of the second electrode structure 16, a central level arm $H_{CENTER}$ of the second electrode structure 16 extends to the center point B2 of the lateral finger overlap range B. Starting from the axis of rotation D of the second electrode structure 16, a maximum level arm $H_{MAX}$ of the second electrode structure 16 extends to the starting point B1 of the lateral finger overlap range B.

Thus, in the maximum deflection position $z_{MAX}$, a minimum vertical immersion path $z_{E1}$ results at the starting point B1 of the lateral finger overlap range B, a central vertical immersion path $z_E$ at the center point B2 of the lateral finger overlap range B and a maximum vertical immersion path $z_{E2}$ at the end point B3 of the lateral finger overlap range B.

According to an embodiment, the central vertical immersion path $z_E$ of FIG. 7 corresponds to the vertical immersion path "$z_E$" (or overlap or vertical overlap) of the edge structure 16-1 of the second electrode structure 16 into the edge structure 14-1 of the first electrode structure 14 according to the above embodiments.

Further, according to an embodiment, the "central" deflection path $z_S$ at the center point B2 of the lateral finger overlap range B corresponds to the maximum deflection path or stroke $z_S$ of the edge structure 16-1 of the second electrode structure 16 into the edge structure 14-1 of the first electrode structure 14 according to the above embodiments.

In the MEMS actuator element 10, in the maximum deflection position $z_{MAX}$, the vertical immersion path "$z_E$" (or overlap) of the edge structure 16-1 of the second electrode structure 16 into the edge structure 14-1 of the first electrode structure 14 is up to 0.5 times the maximum deflection path $z_S$, i.e., $z_E \leq 0.5\, z_S$. The distance between the minimum deflection position $z_{MIN}$ and the maximum immersion position $z_{MAX}$ is referred to as maximum deflection path or stroke $z_S$ and extends along the deflection positions or deflection intermediate positions $z_1$. In the MEMS actuator element 10, the edge structures 14-1, 16-1 of the first and second electrode structure 14, 16 are configured to be opposite to each other with respect to a top view at a lateral distance $x_0$. According to an embodiment, the vertical immersion path $z_E$ can further be between 0.1 and 0.4 times or between 0.2 and 0.3 times the maximum deflection path $z_S$.

Thus, according to an embodiment, the first and second electrode structures 14, 16 are configured to electrostatically deflect the second electrode structure 16 into the intermediate position $z_1$ between the minimum deflection position $z_{MIN}$ and the maximum deflection position $z_{MAX}$ based on an electric control voltage $V_S$. Here, a minimum value of the control voltage VS effects positioning or deflection of the edge structure 16-1 of the second electrode structure 16 into the minimum deflection position $z_{MIN}$ and a maximum value of the control voltage $V_S$ effects a deflection of the edge structure 16-1 of the second electrode structure 16 into the maximum deflection position $z_{MAX}$. The control voltage range (–address voltage range) is between the minimum value of the control voltage $V_S$ and the maximum value of the control voltage $V_S$.

Further, a change of the control voltage $V_S$ in a voltage value between the minimum control voltage $V_{S\_MIN}$ and the maximum control voltage $V_{S\_MAX}$ effects a respective change of the intermediate position $z_1$ of the edge structure 16-1 of the second electrode structure 16 between its minimum and maximum deflection position $z_{MIN}$ and $z_{MAX}$.

According to an embodiment, the MEMS actuator element 10 can further be configured such that the first and second electrode structures 14, 16 are spaced apart by a lateral minimum distance $x_0$ in a plane parallel to the substrate 12, wherein the lateral minimum distance $x_0$ is 0.5 to 1.5 times or 0.6 to 1 times the maximum deflection path $z_S$.

According to an embodiment, the MEMS actuator element 10 can further be configured such that the vertical thickness $d_{14}$, d of the first and/or second electrode structure 14, 16 is 0.6 to 1.2 times or 0.8 to 1.0 times the maximum deflection path $z_S$.

According to an embodiment, the MEMS actuator element 10 can further be configured such that the minimum control voltage is provided as a bias voltage $U_{BIAS}$, wherein the electric control voltage $V_S$ comprises the bias voltage $U_{BIAS}$ and the operating voltage (address voltage) $V_{OPERATION}$, wherein the bias voltage $V_{BIAS}$ can be in a range between 0.5 times to 2 times or 0.8 times to 1.5 times the operating voltage range.

In comb drives or edge drives according to the described embodiments, by the relatively small electrode gap, the electrostatic field can be limited in a spatially narrow range in the area of the electrode fingers 14-2, 16-2. Thereby, relatively high actuator forces can be obtained even with the production-related minimum size of the electrode structures 14, 16 having only a few finger elements 14-2, 16-2. Additionally, the described comb or edge drive allows low crosstalk between adjacent actuators 10.

Figure 8:
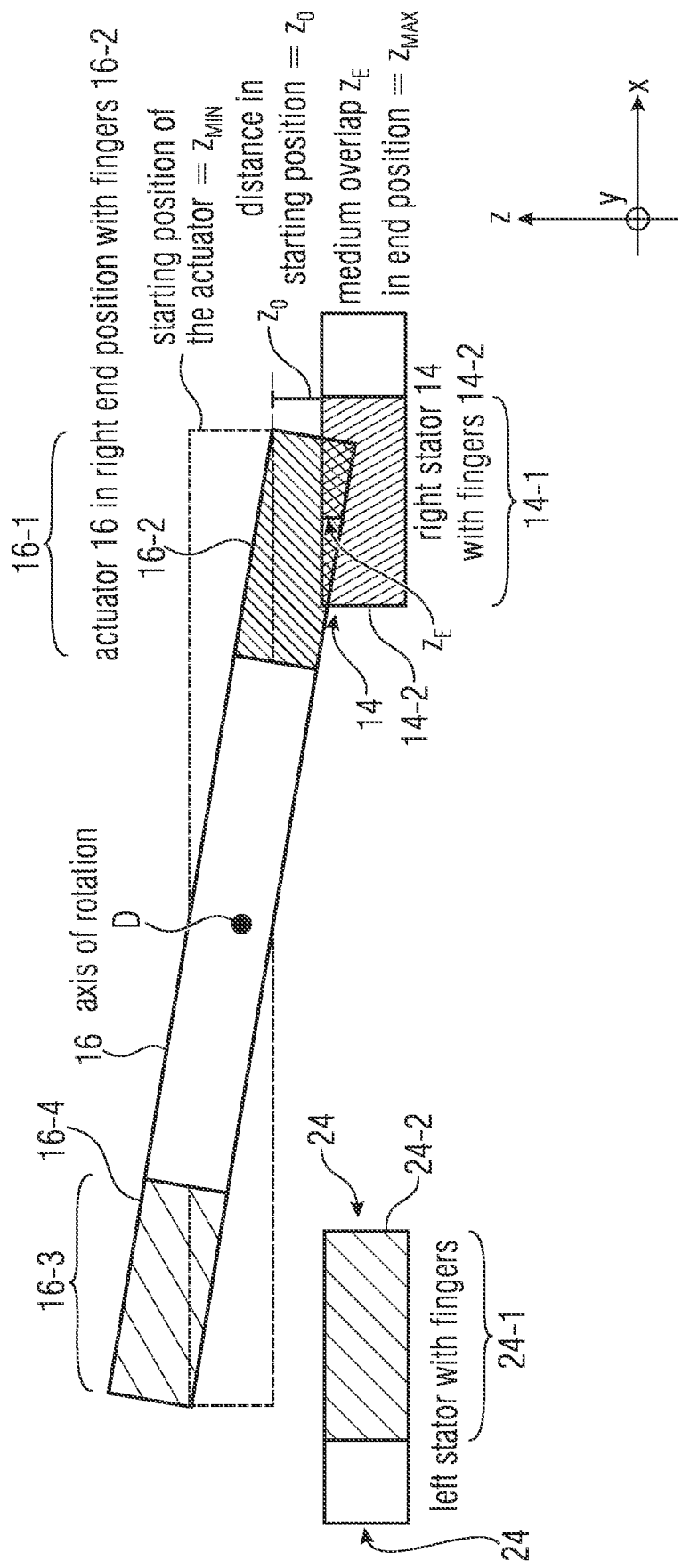
FIG. 8 is a schematic cross-sectional view perpendicular to a tilting axis through part of a MEMS actuator element according to an embodiment, wherein the MEMS actuator element is configured as double-acting tilting actuator.

FIG. 8 shows a schematic cross-sectional view perpendicular to a tilting axis through part of a MEMS actuator element 10 according to an embodiment, wherein the MEMS actuator element 10 is configured as double-acting tilting actuator.

According to an embodiment, the MEMS actuator element 10 can comprise a third electrode structure 24 that is stationary with respect to the substrate 12 and arranged in the same plane (parallel to the x-y plane) as the first electrode structure 14.

In the embodiment of FIG. 8, the second electrode structure 16 extends on both sides symmetrically to the tilting axis or axis of rotation D and has a first edge structure 16-1 and a second edge structure 16-3 on both sides and spaced apart from the tilting axis or axis of rotation.

The second electrode structure 16 is arranged laterally (e.g., symmetrically) between the first and third electrode structures 14, 24, and deflectable. Here, the second electrode structure 16 is electrostatically moveable from the minimum deflection position (=resting position) $z_{MIN}$ into a vertically spaced apart further maximum deflection position (=upper maximum deflection position) $z_{MAX}$, by means of the first and the third electrode structures 14, 24.

The arrangement of finger elements 14-2, 16-2, 16-4 of the edge structures 14-1, 16-1, 16-3 illustrated in FIG. 8 can be periodically continued (at least in portions) to form the edge structures 14-1, 16-1, 16-3 of the first and second electrode structures 14, 16.

Regarding the geometric arrangement of the first and second electrode structures 14, 16 of FIG. 8, further, reference is made to the statements regarding FIG. 7 that are equally applicable herein. Thus, the statements regarding the first and second electrode structures 14, 16 in FIG. 7 are equally applicable to both edge structures 16-1, 16-3 of the second electrode structures 16 arranged on both sides of the axis of rotation D with respect to the respectively allocated first and third electrode structures 14, 24 of FIG. 8, i.e., on the immersion of the first edge structure 16-1 of the second electrode structure 16 into the edge structure 14-1 of the first electrode structure 14 as well as the immersion of the second edge structure 16-3 of the second electrode structure 16 into the edge structure 24-1 of the third electrode structure 24 during a rotational movement around the axis of rotation.

The dotted illustration of the second electrode structure 16 represents, for example, a minimum deflection position (base position) $z_{MIN}$ of the second electrode structure 16, while the continuously drawn contour of the second electrode structure 16 represents the maximum deflection position $z_{MAX}$ of the second electrode structure 16, wherein FIG. 8 illustrates the vertical immersion path "$z_E$" (or overlap) of the first edge structure 16-1 of the second electrode structure 16 into the edge structure 14-1 of the first electrode structure 14. Equally, a vertical immersion path "$z_E$" (or overlap) of the second edge structure 16-3 of the second electrode structure 16 into the edge structure 24-1 of the third electrode structure 24 can be obtained in a rotational movement around the axis of rotation.

The geometric and electric design parameters for the MEMS actuator element 10 of FIG. 8 can be adapted and adjusted as in the above-described embodiments.

In the following, some significant technical effects of the MEMS actuator element 100 will be summarized again.

The present inventive concept allows the realization of MEMS actuator elements 10 (=micromechanical electrostatic actuators) 10 having a large deflection range with small lateral dimensions that show very low crosstalk between adjacent pixels compared to common plate actuators as well as an improved linearity of the characteristic curve.

The present inventive concept is suitable for micromechanical actuators, in particular, for phase shifting SLM (SLM=spatial light modulator, an array for modulating a laser beam) having very small pixels (measured at the producible mechanical structure sizes or the desired deflection). Such SLM are particularly interesting for digital holography, both for future holographic displays as well as for (more obvious) applications, such as universal laser tweezers, wavefront modeling and fast optical switches for optical fiber networks, where such SLM allow the simultaneous splitting as well as control of direction divergence and intensity of laser beams. The usage in other devices for pattern generation or control of light distribution seems useful. Above that, multiple other applications in microactuator technology (also without micromirrors) as well as sensor technology are possible.

The present inventive concept is also suitable for MEMS actuators 10, wherein more than two stages of the deflection are obtained by individually addressing several electrodes with a binary voltage value. For example, the moveable electrode (on fixed electric potential, bias voltage) 4 can be opposed by electrically separate stationary electrodes each connected to an SRAM memory cell of the address electronics. Each SRAM cell can only assume one of two states and provide the connected electrode with one of two voltages. If the 4 electrodes generate differently strong forces by different edge lengths (numbers of fingers), with a pure digital control in the example, up to 16 stages in the analog deflection range of the actuator can be controlled, i.e., without pull-in and without mechanical stops. In that case, due to the relatively good linearity of the characteristic curve of this invention, a significant improvement of the grading of the deflection states with respect to a plate actuator having several electrodes can be obtained. The same would accordingly also work with a stationary and several moveable electrodes.

The present invention can be very well be combined with springs according to patent [8] or even better, application [9].

Figure 9:
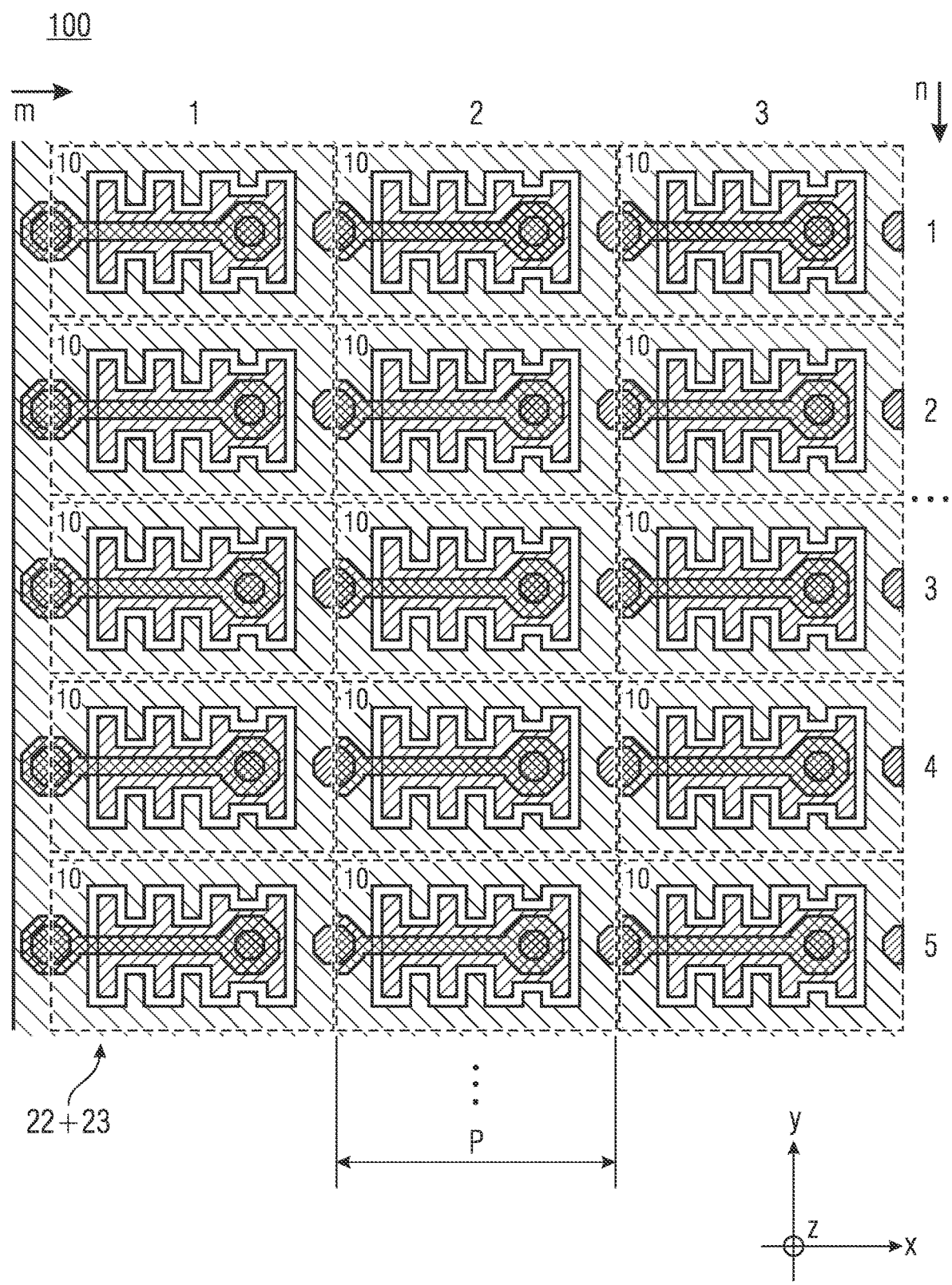
FIG. 9 is a schematic top view of a regular array of MEMS actuator elements according to an embodiment.

FIG. 9 shows a schematic top view of a regular MEMS array 100 of MEMS actuator elements 10 according to an embodiment. The MEMS array 100 of FIG. 9 comprises a plurality of symmetrically arranged MEMS actuator elements 10 such as the rectangular MEMS actuator elements 10 of FIG. 4. However, it should become clear that the illustrated array arrangement can be implemented with all above-described MEMS actuator elements 10.

FIG. 9 shows exemplarily the MEMS actuator array 100 in an n×m-array arrangement (n, m=positive integer numbers) having n=5 rows and m=3 columns. The rows and columns can essentially be continued in any way to obtain the MEMS actuator array 100 having at least 10,000 MEMS actuator elements 10.

According to an embodiment, the MEMS actuator array 100 includes a plurality of MEMS actuator elements 10 and further control means 22 for providing an individual control voltage between the first and second electrode structures 14, 16 of the respective MEMS actuator elements 10. The control means 22, for example, is configured to provide each individual or different groups of the MEMS actuator elements 10 with an individual control voltage $V_S$.

According to an embodiment, at least a subset of the MEMS actuator elements 10 or also all MEMS actuator elements 10 can comprise a common first electrode structure 14 that is stationary with respect to the substrate 12.

According to an embodiment, at least a subset of the MEMS actuator elements 10 or also all MEMS actuator elements 10 can have a common third electrode structure that is stationary with respect to the substrate, wherein the control means 22 is further configured to provide a further individual control voltage between the second and third electrode structures 14, 24 of the respective MEMS actuator elements 10.

According to an embodiment, the MEMS actuator elements 10 can comprise micromirror elements 20 that are each coupled to one of the second electrode structures 16, wherein the micromirror elements 20 are deflectable according to the deflection of the allocated second electrode structure 16.

According to an embodiment, the second electrode structures 16 of the MEMS actuator elements 10 are deflectable into at least an intermediate position $z_1$, each between the minimum and maximum deflection position $z_{MIN}$, $z_{MAX}$, based on the control voltage $V_S$ and/or into at least one further intermediate position $z'_1$, each between the minimum deflection position $z_{MIN}$ and further maximum deflection position $z'_{MAX}$, based on the further control voltage $V'_S$.

According to an embodiment, the control voltage $V_S$ and/or the further control voltage $V'_S$ comprise a respective address voltage $V_{OPERATION}$, $V_{OPERATION}$ for the MEMS actuator elements 10 and further a respective bias voltage $V_{BIAS}$, $V'_{BIAS}$ for the MEMS actuator elements 10, wherein the bias voltage $V_{BIAS}$, $V'_{BIAS}$ is in a range between 0.5 times and 2 times or between 0.8 times and 1.5 times the maximum value of the address voltage $V_{OPERATION}$, $V_{OPERATION}$.

According to an embodiment, the MEMS actuator array 100 further comprises a CMOS backplane as the substrate 12, wherein the CMOS backplane comprises the control means 22 and further memory cells 23.

According to an embodiment, the MEMS actuator array 100 comprises at least 10,000 MEMS actuator elements 10 in an n×m arrangement, with n rows and m columns. According to an embodiment, the MEMS actuator elements 10 of the MEMS actuator array 100 have a pitch P of less than or equal to 20 µm or 10 µm. According to an embodiment, the MEMS actuator elements 10 of the MEMS actuator array 100 have a pitch P between 5 µm and 20 µm.

According to an embodiment, the MEMS actuator array 100 comprises a plurality of MEMS actuator elements 10, wherein the MEMS actuator elements 10 comprise a substrate 12, a first electrode structure 14 with an edge structure 14-1 that is stationary with respect to the substrate 12 and a second electrode structure 16 with an edge structure 16-1.

The second electrode structure 16 is deflectably coupled to the substrate 12 by means of a spring structure 18 and is electrostatically deflectable by means of the first electrode structure 14 to move the edge structure 16-1 of the second electrode structure 16 into an intermediate position $z_1$ between a minimum deflection position $z_{MIN}$ and a vertically spaced-apart maximum deflection position $z_{MAX}$, wherein the minimum and maximum deflection positions $z_{MIN}$, $z_{MAX}$ specify a maximum deflection path $z_S$.

The edge structures 14-1, 16-1 of the first and second electrode structures 14, 16 are configured to be opposite to each other with respect to a top view and are vertically spaced-apart in the minimum deflection position $z_{MIN}$.

In the maximum deflection position $z_{MAX}$, the vertical immersion path $z_E$ of the edge structure 16-1 of the second electrode structure 16 into the edge structure 14-1 of the first electrode structure 14 is up to 0.5 times the maximum deflection path $z_S$, with $z_E \leq 0.5\ z_S$.

The first and second electrode structures 14, 16 are spaced apart by a lateral minimum distance (=by a medium or effective lateral distance) $x_0$ in a plane parallel to a substrate 12, wherein the lateral minimum distance $x_0$ is 0.5 times to 1.5 times or 0.6 to 1 times the maximum deflection path $z_S$.

The vertical thickness (medium or effective vertical thickness) $d_{14}$, $d_{16}$ of the first and/or second electrode structure 14, 16 is 0.6 to 1.2 times or 0.8 to 1.0 times the maximum deflection path $z_S$.

The MEMS actuator elements 10 have a pitch P of less than or equal to 20 μm.

Further, the MEMS actuator array 100 includes control means 22 for providing an individual control voltage $V_S$ between the first and second electrode structures 14, 16 of the respective MEMS actuator elements 10.

According to an embodiment, in the maximum deflection position $z_{MAX}$, the vertical immersion path $z_E$ of the edge structure 16-1 of the second electrode structure 16 with respect to the edge structure 14-1 of the first electrode structure 14 is between 0.1 and 0.4 times or between 0.2 and 0.3 times the maximum deflection path $z_S$.

Based on the above design parameters for the MEMS actuator element, a maximum deflection $z_S$ (stroke) that is desired or requested for the respective application can be set, wherein, for the size of the maximum deflection requested or specified by the application, a MEMS actuator element with optimized (=minimum) dimensions (pitch) for the respective application case, an optimized (=minimum) drive voltage, a linear characteristic curve and low crosstalk to adjacent MEMS actuator elements can be obtained.

In the following, a summary of embodiments of the MEMS actuator element 10 and its structure as well as the MEMS actuator array 100 having a plurality of MEMS actuator elements 10 is illustrated.

According to an aspect, a MEMS actuator element comprises: a substrate, a first electrode structure with an edge structure that is stationary with respect to the substrate, a second electrode structure with an edge structure, wherein the second electrode structure is deflectably coupled to the substrate by means of a spring structure and electrostatically deflectable by means of the first electrode structure to move the edge structure of the second electrode structure into an intermediate position [deflection position] between a minimum deflection position and a vertically spaced-apart maximum deflection position, wherein the minimum and maximum deflection positions specify a maximum deflection path (=stroke), wherein the edge structures of the first and second electrode structures are configured to be opposite to each other with respect to a top view and are vertically spaced apart in a minimum deflection position and wherein, in the maximum deflection position, the vertical immersion path of the edge structure of the second electrode structure into the edge structure of the first electrode structure is up to 0.5 times the maximum deflection path.

According to a further aspect, the first and second electrode structures are configured to electrostatically deflect the second electrode structure into the intermediate positon between the minimum deflection position and the maximum deflection position based on an electric control voltage, wherein a minimum control voltage effects deflection of the edge structure of the second electrode structure into the minimum deflection position and a maximum control voltage effects deflection into the maximum deflection position.

According to a further aspect, a change of the control voltage into an intermediate voltage between the minimum control voltage and the maximum control voltage effects a respective change of the intermediate position of the edge structure of the second electrode structure between the minimum deflection position and the maximum deflection position.

According to a further aspect, in the maximum deflection position, the vertical immersion path of the edge structure of the second electrode structure with respect to the edge structure of the first electrode structure is between 0.1 and 0.4 times or between 0.2 and 0.3 times the maximum deflection path.

According to a further aspect, the first and second electrode structures are spaced apart by a lateral minimum distance $x_0$ in a plane parallel to the substrate, wherein the lateral minimum distance is 0.5 to 1.5 times or 0.6 to 1 times the maximum deflection path.

According to a further aspect, the vertical thickness of the first and/or second electrode structure is 0.6 to 1.2 times or 0.8 to 1.0 times the maximum deflection path.

According to a further aspect, the minimum control voltage is provided as bias voltage, wherein the electric control voltage comprises the bias voltage and an operating voltage ($V_{OPERATION}$), wherein the bias voltage is in a range between 0.5 times to 2 times or 0.8 times to 1.5 times the operating voltage range.

According to a further aspect, the second electrode structure is deflectable in a rotatory and/or translatory manner with respect to the first electrode structure.

According to a further aspect, the edge structure of the second electrode structure is configured to engage the edge structure of the first electrode structure with respect to a top view.

According to a further aspect, the edge structure of the first electrode structure comprises a finger or comb structure and the edge structure of the second electrode structure comprises a further finger or comb structure.

According to a further aspect, the MEMS actuator element further comprises: a third electrode structure that is stationary with respect to the substrate, wherein the second electrode structure is arranged (symmetrically) between the first and third electrode structures and is deflectable, wherein the second electrode structure is electrostatically movable by means of the first and third electrode structures from the minimum deflection position into a vertically spaced-apart further maximum deflection position.

According to a further aspect, the minimum deflection position and further maximum deflection position indicate a further maximum deflection path.

According to a further aspect, the edge structure of the second electrode structure is further movable along the deflection path into the further maximum deflection position with respect to the edge structure of the third electrode structure, wherein, in the further maximum deflection position, the vertical immersion path of the edge structure of the second electrode structure with respect to the edge structure of the third electrode structure is up to 0.5 times the maximum deflection path.

According to a further aspect, in the further maximum deflection position, the vertical immersion path of the edge structure of the second electrode structure with respect to the edge structure of the third electrode structure is between 0.1 and 0.4 times or between 0.2 and 0.3 times the further maximum deflection path.

According to a further aspect, the first and third electrode structures are spaced apart by a lateral minimum distance $Y_1$ in a plane parallel to the substrate, wherein the lateral minimum distance $Y_1$ is 0.5 to 1.5 times or 0.6 to 1 times the further maximum deflection path.

According to a further aspect, the vertical thickness of the third electrode structure is 0.6 to 1.2 times or 0.8 to 1.0 times the further maximum deflection path.

According to a further aspect, the edge structure of the third electrode structure comprises a finger or comb structure.

According to a further aspect, the MEMS actuator element further comprises: control means for providing a control voltage between the first and second electrode structures of the MEMS actuator element and/or for providing a further control voltage between the second and third electrode structures of the MEMS actuator element.

According to one aspect, a MEMS actuator array comprises: a plurality of MEMS actuator elements according to one of the preceding aspects and control means for providing an individual control voltage between the first and second electrode structures of the respective MEMS actuator elements.

According to a further aspect, at least a subset (or all) MEMS actuators comprise a common first electrode structure that is stationary with respect to the substrate.

According to a further aspect, at least a subset (or all) MEMS actuators comprise a common third electrode structure that is stationary with respect to the substrate, wherein the control means is further configured to provide a further control voltage between the second and third electrode structures.

According to a further aspect, the MEMS actuators comprise micromirror elements that are each coupled to one of the second electrode structures, wherein the micromirror elements are deflectable with respect to the deflection of the second electrode structure.

According to a further aspect, the second electrode structures of the MEMS actuators are each deflectable into at least an intermediate position between the minimum and maximum deflection position based on the control voltage, and/or into at least an intermediate position between the minimum deflection position and further maximum deflection position based on the further control voltage.

According to a further aspect, the control voltage and/or the further control voltage comprise a respective address voltage for the MEMS actuator elements and further a respective bias voltage for the MEMS actuator elements, wherein the bias voltage is in a range between 0.5 times and 2 times or between 0.8 times and 1.5 times a maximum value of the address voltage.

According to a further aspect, the MEMS actuator array comprises: a CMOS backplane as the substrate, wherein the CMOS backplane comprises the control means and further memory cells.

According to a further aspect, the MEMS actuator array comprises at least 10,000 MEMS actuator elements.

According to a further aspect, the MEMS actuator elements have a pitch of less than or equal to 20 μm.

According to an embodiment, the MEMS actuator array comprises a plurality of MEMS actuator elements, wherein the MEMS actuator elements comprise a substrate, a first electrode structure with an edge structure that is stationary with respect to the substrate and a second electrode structure with an edge structure.

The second electrode structure is deflectably coupled to the substrate by means of a spring structure and electrostatically deflectable by means of the first electrode structure to move the edge structure of the second electrode structure into an intermediate position $z_1$ between a minimum deflection position $z_{MIN}$ and a vertically spaced-apart maximum deflection position $z_{MAX}$, wherein the minimum and maximum deflection positions $z_{MIN}$, $z_{MAX}$ specify a maximum deflection path $z_S$.

The edge structures of the first and second electrode structures are configured to be opposite to each other with respect to a top view and are vertically spaced apart in a minimum deflection position $z_{MIN}$.

In the maximum deflection position $z_{MAX}$, the vertical immersion path $z_E$ of the edge structure of the second electrode structure into the edge structure of the first electrode structure is up to 0.5 times the maximum deflection path $z_S$, with $z_E$ 0.5 $z_S$.

The first and second electrode structures are spaced apart by a lateral minimum distance (by a medium or effective lateral distance) $x_0$ in a plane parallel to the substrate, wherein the lateral minimum distance $x_0$ is 0.5 to 1.5 times or 0.6 to 1 times the maximum deflection path $z_S$.

The vertical thickness (=medium or effective vertical thickness) $d_{14}$, $d_{16}$ of the first and/or second electrode structure is 0.6 to 1.2 times or 0.8 to 1.0 times the maximum deflection path $z_S$.

The MEMS actuator elements 10 have a pitch P of less than or equal to 20 μm.

Further, the MEMS actuator array includes control means for providing an individual control voltage $V_S$ between the first and second electrode structure of the respective MEMS actuator elements.

According to an embodiment, in the maximum deflection position $z_{MAX}$, the vertical immersion path $z_E$ of the edge structure of the second electrode structure with respect to the edge structure of the first electrode structure is between 0.1 and 0.4 times or between 0.2 and 0.3 times the maximum deflection path $z_S$.

Although some aspects of the present disclosure have been described as features in the context of an apparatus, it is obvious that such a description can also be considered as a description of respective method features. Although some aspects have been described as features in the context of a method, it is obvious that such a description can also be considered as a description of respective features of an apparatus or the functionality of an apparatus.

In the above detailed description, different features have partly been grouped together in examples to streamline the disclosure. This type of disclosure is not to be interpreted as the intent that the claimed examples comprise more features than explicitly stated in each claim. Rather, as the following claims will show, the subject matter can be in less than all features of an individual disclosed example. Consequently, the following claims are incorporated in the detailed description, wherein each claim can stand as its own separate example. While each claim can stand as its own separate example, it should be noted that although dependent claims in the claims relate to a specific combination with one or several other claims, other examples can also include a combination of dependent claims with the subject matter of each other dependent claim or a combination of each feature with the other dependent or independent claims. Such combinations are comprised, except it is stated that a specific combination is not intended. Further, it is intended that a combination of features of the claims with each of the other independent claims is also comprised, even when this claim is not directly dependent on the independent claim.

While this invention has been described in terms of several advantageous embodiments, there are alterations, permutations, and equivalents, which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

1. Peter Dürr, Andreas Gehner, Jan Schmidt, Detlef Kunze, Michael Wagner, Hubert Lakner: 'Micro-actuator with extended analog deflection at low drive voltage', Proceedings of SPIE Vol. 6114 (2006)
2. A. Gehner et al., "Micromirror arrays for wavefront correction", SPIE Vol. 4178, pp. 348-357 (2000).
3. Hubert Lakner et al.: "Design and Fabrication of Micromirror Arrays for UV-Lithography", Proc of SPIE Vol. 4561 (2001)
4. Harald Schenk et al.: "A Novel Electrostatically Driven Torsional Actuator", Proc. 3rd Int. Conf. on Micro Opto Electro Mechanical Systems (1999)
5. L. Clark et al.: 'Vertical comb drive actuated deformable mirror device and method', U.S. Pat. No. 6,384,952
6. T. Sandner: 'Method of fabricating a micromechanical out of two-dimensional . . . ', U.S. Pat. No. 7,929,192
7. Veljko Milanovic et al.: 'Gimbal-less micro-electro-mechanical system . . . ', U.S. Pat. No. 7,295,726
8. Peter Dürr et al.: 'MEMS Aktuator, System mit einer Mehrzahl vom MEMS Aktuatoren und Verfahren . . . ', Patent DE102015200626, patent application US2017297897AA
9. Peter Dürr et al.: 'MEMS mit einem beweglichen Strukturelement und MEMS-Array', German patent application 102018207783.5 (not yet published)

The invention claimed is:

1. A MEMS (micro-electromechanical system) actuator element, comprising:
a substrate,
a first electrode structure with an edge structure that is stationary with respect to the substrate,
a second electrode structure with an edge structure, wherein the second electrode structure is deflectably coupled to the substrate by means of a spring structure and electrostatically deflectable by means of the first electrode structure to move the edge structure of the second electrode structure into an intermediate position between a minimum deflection position and a vertically spaced-apart maximum deflection position, wherein the minimum and maximum deflection positions specify a maximum deflection path,
wherein the edge structures of the first and second electrode structures are configured to be opposite to each other with respect to a top view and are vertically spaced apart in the minimum deflection position and wherein, in the maximum deflection position, the vertical immersion path of the edge structure of the second electrode structure into the edge structure of the first electrode structure is up to 0.5 times the maximum deflection path $z_S$, with $z_E \leq 0.5\, z_S$.

2. The MEMS actuator element according to claim 1, wherein the first and second electrode structures are configured to electrostatically deflect the second electrode structure into the intermediate position between the minimum deflection position and the maximum deflection position based on an electric control voltage, wherein a minimum control voltage effects deflection of the edge structure of the second electrode structure into the minimum deflection position and a maximum control voltage effects deflection into the maximum deflection position.

3. The MEMS actuator element according to claim 2, wherein a change of the control voltage into an intermediate voltage between the minimum control voltage and the maximum control voltage effects a respective change of the intermediate position of the edge structure of the second electrode structure between the minimum deflection position and the maximum deflection position.

4. The MEMS actuator element according to claim 1, wherein, in the maximum deflection position, the vertical immersion path of the edge structure of the second electrode structure with respect to the edge structure of the first electrode structure is between 0.1 and 0.4 times or between 0.2 and 0.3 times the maximum deflection path.

5. The MEMS actuator element according to claim 1, wherein the first and second electrode structures are spaced apart by a lateral minimum distance in a plane parallel to the substrate, wherein the lateral minimum distance is 0.5 to 1.5 times or 0.6 to 1 times the maximum deflection path.

6. The MEMS actuator element according to claim 1, wherein the vertical thickness of the first and/or second electrode structure is 0.6 to 1.2 times or 0.8 to 1.0 times the maximum deflection path.

7. The MEMS actuator element according to claim 1, wherein the minimum control voltage is provided as bias voltage, and wherein the electric control voltage comprises the bias voltage and an operating voltage, wherein the bias voltage is in a range between 0.5 times to 2 times or 0.8 times to 1.5 times the operating voltage range.

8. The MEMS actuator element according to claim 1, wherein the second electrode structure is deflectable in a translatory and/or rotatory manner with respect to the first electrode structure.

9. The MEMS actuator element according to claim 1, wherein the edge structure of the second electrode structure is configured to engage the edge structure of the first electrode structure with respect to a top view.

10. The MEMS actuator element according to claim 1, wherein the edge structure of the first electrode structure comprises a finger or comb structure and wherein the edge structure of the second electrode structure comprises a further finger or comb structure.

11. The MEMS actuator element according to claim 1, further comprising:
a third electrode structure that is stationary with respect to the substrate, wherein the second electrode structure is arranged between the first and third electrode structures and is deflectable, wherein the second electrode structure is electrostatically moveable from the minimum deflection position into a vertically spaced-apart further maximum deflection position by means of the first and third electrode structures.

12. The MEMS actuator element according to claim 11, wherein the minimum deflection position and further maximum deflection position specify a further maximum deflection path.

13. The MEMS actuator element according to claim 11, wherein the edge structure of the second electrode structure is further movable along the deflection path into the further maximum deflection position with respect to the edge structure of the third electrode structure and wherein, in the further maximum deflection position, the vertical immersion path of the edge structure of the second electrode structure with respect to the edge structure of the third electrode structure is up to 0.5 times the further maximum deflection path, with $z'_E \leq 0.5\, z'_S$.

14. The MEMS actuator element according to claim 11, wherein, in the further maximum deflection position, the vertical immersion path of the edge structure of the second electrode structure with respect to the edge structure of the third electrode structure is between 0.1 and 0.4 times or between 0.2 and 0.3 times the further maximum deflection path.

15. The MEMS actuator element according to claim 11, wherein the second and third electrode structures are spaced apart by a lateral minimum distance in a plane parallel to the substrate, wherein the lateral minimum distance is 0.5 to 1.5 times or 0.6 to 1 times the further maximum deflection path.

16. The MEMS actuator element according to claim 11, wherein the vertical thickness of the third electrode structure is 0.6 to 1.2 times or 0.8 to 1.0 times the further maximum deflection path.

17. The MEMS actuator element according to claim 1, wherein the edge structure of the third electrode structure comprises a finger or comb structure.

18. The MEMS actuator element according to claim 1, further comprising:
a control for providing a control voltage between the first and second electrode structures of the MEMS actuator element and/or for providing a further control voltage between the second and third electrode structures of the MEMS actuator element.

19. A MEMS (micro-electromechanical system) actuator array, comprising:
a plurality of MEMS actuator elements according to claim 1 and
a control for providing an individual control voltage between the first and second electrode structures of the respective MEMS actuator elements.

20. The MEMS actuator array according to claim 19, wherein at least a subset or all MEMS actuator elements comprise a common first electrode structure that is stationary with respect to the substrate.

21. The MEMS actuator array according to claim 19, wherein at least a subset or all MEMS actuator elements comprise a common third electrode structure that is stationary with respect to the substrate and
wherein the control is further configured to provide a further control voltage between the second and third electrode structures.

22. The MEMS actuator array according to claim 19, wherein the MEMS actuator elements comprise micromirror elements that are each coupled to one of the second electrode structures, wherein the micromirror elements are deflectable according to the deflection of the second electrode structure.

23. The MEMS actuator array according to claim 19, wherein the second electrode structures of the MEMS actuator elements are deflectable into at least one intermediate position, each between the minimum and maximum deflection position, based on the control voltage and/or into at least an intermediate position, each between the minimum deflection position and further maximum deflection position, based on the further control voltage.

24. The MEMS actuator array according to claim 19, wherein the control voltage and/or the further control voltage comprise a respective address voltage for the MEMS actuator elements and further a respective bias voltage for the MEMS actuator elements and
wherein the bias voltage is in a range between 0.5 times and 2 times or between 0.8 times and 1.5 times a maximum value of the address voltage.

25. The MEMS actuator array according to claim 19, comprising:
a CMOS backplane as the substrate, wherein the CMOS backplane comprises the control and further memory cells.

26. The MEMS actuator array according to claim 19, wherein the MEMS actuator array comprises at least 10,000 MEMS actuator elements.

27. The MEMS actuator array according to claim 19, wherein the MEMS actuator elements comprise a pitch of less than or equal to 20 μm.

28. A MEMS (micro-electromechanical system) actuator element, comprising:
a substrate,
a first electrode structure with an edge structure that is stationary with respect to the substrate,
a second electrode structure with an edge structure, wherein the second electrode structure is deflectably coupled to the substrate by means of a spring structure and electrostatically deflectable between the first and second electrode structures by means of a control voltage to move the edge structure of the second electrode structure into an intermediate position between a minimum deflection position and a vertically spaced-apart maximum deflection position, wherein the minimum and maximum deflection positions specify a maximum deflection path,
wherein the edge structures of the first and second electrode structures are configured to be opposite to each other with respect to a top view and are vertically spaced-apart in the minimum deflection position, and wherein the first and second electrode structures are spaced apart by a lateral minimum distance in a plane parallel to the substrate, wherein the lateral minimum distance is 0.5 to 1.5 times or 0.6 to 1 times the maximum deflection path, and
wherein the vertical thickness of the first and/or second electrode structure is 0.6 to 1.2 times or 0.8 to 1.0 times the maximum deflection path, and
wherein, in the maximum deflection position, the vertical immersion path of the edge structure of the second electrode structure into the edge structure of the first electrode structure is up to 0.5 times the maximum deflection path $z_S$, with $z_E \leq 0.5\, z_S$, and
a control configured to provide the control voltage between the first and second electrode structures to electrostatically deflect the second electrode structure into the intermediate position between the minimum deflection position and the maximum deflection position based on an electric control voltage, wherein a minimum control voltage effects deflection of the edge structure of the second electrode structure into the minimum deflection position and a maximum control voltage effects deflection into the maximum deflection position.

29. A MEMS (micro-electromechanical system) actuator array, comprising:
a plurality of MEMS actuator elements, wherein the MEMS actuator elements comprise a substrate, a first electrode structure with an edge structure that is stationary with respect to the substrate and a second electrode structure with an edge structure,
wherein the second electrode structure is deflectably coupled to the substrate by means of a spring structure and electrostatically deflectable by means of the first electrode structure to move the edge structure of the second electrode structure into an intermediate position between a minimum deflection position and a vertically spaced-apart maximum deflection position, wherein the minimum and maximum deflection positions specify a maximum deflection path,
wherein the edge structures of the first and second electrode structures are configured to be opposite to each other with respect to a top view and are vertically spaced apart in a minimum deflection position,
wherein, in the maximum deflection position, the vertical immersion path of the edge structure of the second electrode structure into the edge structure of the first electrode structure is up to 0.5 times the maximum deflection path $z_S$, with $z_E \leq 0.5\, z_S$,
wherein the first and second electrode structures are spaced apart by a lateral minimum distance in a plane parallel to the substrate, wherein the lateral minimum distance is 0.5 to 1.5 times the maximum deflection path and
wherein the vertical thickness of the first and/or second electrode structure is 0.6 to 1.2 times the maximum deflection path and
a control for providing an individual control voltage between the first and second electrode structures of the respective MEMS actuator elements,
wherein the MEMS actuator elements comprise a pitch of less than or equal to 20 μm.

30. The MEMS actuator element according to claim 29, wherein, in a maximum deflection position, the vertical immersion path of the edge structure of the second electrode structure with respect to the edge structure of the first electrode structure is between 0.1 and 0.4 times or between 0.2 and 0.3 times the maximum deflection path.

* * * * *